(12) United States Patent
Hara et al.

(10) Patent No.: US 7,083,660 B2
(45) Date of Patent: Aug. 1, 2006

(54) CASING MEMBER AND METHOD FOR MANUFACTURING THE SAME

(75) Inventors: Kouichi Hara, Obu (JP); Atsushi Fukunishi, Toyota (JP)

(73) Assignee: Tokai Kogyo Company Limited, Aichi-Pref. (JP)

( * ) Notice: Subject to any disclaimer, the term of this patent is extended or adjusted under 35 U.S.C. 154(b) by 227 days.

(21) Appl. No.: 10/291,397

(22) Filed: Nov. 12, 2002

(65) Prior Publication Data

US 2003/0094101 A1 May 22, 2003

(30) Foreign Application Priority Data

Nov. 15, 2001 (JP) ............................. 2001-349803

(51) Int. Cl.
*B01D 19/00* (2006.01)
(52) U.S. Cl. .................. 55/385.4; 55/385.1; 55/524; 55/527; 96/13; 96/14; 96/134
(58) Field of Classification Search ............... 55/385.4, 55/385.1, 524, 527, DIG. 30; 96/13, 14, 96/134
See application file for complete search history.

(56) References Cited

U.S. PATENT DOCUMENTS

| | | | |
|---|---|---|---|
| 3,951,293 A | | 4/1976 | Schulz |
| 4,187,390 A | | 2/1980 | Gore |
| 4,636,446 A | | 1/1987 | Lee |
| 4,859,546 A | | 8/1989 | Binder et al. |
| 4,957,518 A | * | 9/1990 | Brassell ............... 96/4 |
| 5,215,312 A | | 6/1993 | Knappe et al. |
| 5,407,760 A | | 4/1995 | Kasner et al. |
| 5,476,589 A | | 12/1995 | Bacino |
| 5,522,769 A | | 6/1996 | DeGuiseppi |
| 5,578,491 A | | 11/1996 | Kayal et al. |
| 5,725,645 A | * | 3/1998 | Wickland et al. ............... 96/17 |
| 5,891,223 A | * | 4/1999 | Shaw et al. ................... 96/134 |
| 5,914,415 A | * | 6/1999 | Tago .......................... 55/385.4 |

(Continued)

FOREIGN PATENT DOCUMENTS

DE 3622773 1/1988

(Continued)

OTHER PUBLICATIONS

Patent Abstracts of Japan Publication No. 10-328521, Publication date Dec. 15, 1998.

(Continued)

*Primary Examiner*—Minh-Chau T. Pham
(74) *Attorney, Agent, or Firm*—Wenderoth, Lind & Ponack, L.L.P.

(57) ABSTRACT

A connector casing E required to have a sealing property includes a cover 2. The cover 2 has a cover main body 10 provided with a large vent hole $H_0$ passing through the connector casing E in an inward and outward direction and having a predetermined inner diameter size. A permeable sheet S, which permits permeation of a gas and prevents permeation of a liquid and a solid, is integrally joined to an outside peripheral part of the large vent hole $H_0$ so as to cover the large vent hole $H_0$ from its outside. A cover insert member C is disposed outside the permeable sheet S to cover the permeable sheet from the outside, and a ring-shaped protrusion 22 is hermetically joined to the casing main body 10. The cover insert member $C_1$ is provided with a small vent hole $H_1$ which has an inner diameter smaller than the large vent hole $H_0$ and communicates with the large vent hole $H_0$ through the permeable sheet S.

17 Claims, 14 Drawing Sheets

U.S. PATENT DOCUMENTS

| | | |
|---|---|---|
| 6,092,812 A | 7/2000 | Ursel et al. |
| 6,360,540 B1 | 3/2002 | Kottmyer |
| 6,368,741 B1 | 4/2002 | Hackel et al. |
| 6,468,332 B1 * | 10/2002 | Goglio et al. .................. 96/134 |
| 6,524,361 B1 * | 2/2003 | Thornton et al. .......... 55/385.4 |
| 6,827,232 B1 | 12/2004 | Hara et al. |

FOREIGN PATENT DOCUMENTS

| | | |
|---|---|---|
| DE | 3933877 A | 4/1990 |
| DE | 19702685 A | 7/1998 |
| EP | 0 326 812 | 8/1989 |
| EP | 0 377 067 | 7/1990 |
| EP | 0 484 288 | 5/1992 |
| EP | 0522183 A | 1/1993 |
| EP | 0600271 A | 6/1994 |
| EP | 0856897 | 8/1998 |
| EP | 1133222 A | 9/2001 |
| JP | 62-181766 | 11/1987 |
| JP | 6-31130 | 2/1994 |
| SE | 9900116 A | 7/2000 |
| WO | 01/20958 | 3/2001 |

OTHER PUBLICATIONS

Patent Abstracts of Japan Publication No. 02-151097, Publication date Jun. 11, 1990.

* cited by examiner

CASING MEMBER AND METHOD FOR MANUFACTURING THE SAME

FIELD OF THE INVENTION

The present invention relates to a casing main body and a cover as component members of a casing assembly, and particularly to a casing component member in which the outside of a large vent hole provided in at least a part of the member is covered with a permeable member, and a method of manufacturing the same.

BACKGROUND ART

As an example of a casing assembly required to have the foregoing performance, as shown in FIG. 20, a connector casing E' for housing a microcomputer for controlling a vehicle engine or the like, or various electric·electronic equipments can be cited. This connector casing E' is fitted in an engine room or a vehicle compartment, and is used to control the operation of an engine or to control various driving devices of the vehicle. In order to maintain the control to be accurately carried out without an erroneous operation, that is, in order to always accurately and stably operate the housed microcomputer or various electric·electronic equipment, it is necessary to prevent water droplets or dust etc. from entering the connector casing E'.

In order to satisfy such a request, for example, if the connector casing is completely sealed hermetically, the object of preventing the water droplet, the dust etc., or the like from entering is achieved. However, heat is generated at the time of operation of the inner microcomputer or various electric·electronic equipment, and the air in the connector is heated and expanded by this heat generation. As a result, the pressure in the casing becomes high, and there is a case where a sealed portion of the casing is partially broken. Further, because of the temperature rise due to the heat generation, there is a danger that an erroneous operation will occur in the equipment such as the inner computer, or a deterioration in performance will be caused.

In order to solve such problems, an article in which a vent hole $H_0'$ is formed at a part of a cover 2' of the connector casing E' is known. A gas permeable sheet S' which permits a variety of gases, such as air, and moisture in the air to permeate through and prevents water drops from permeating through, is attached so as to close this vent hole $H_0'$.

The cover 2' of this connector casing E' is molded by injection molding of a synthetic resin so as to have the vent hole $H_0'$. After the molding, the permeable sheet S' is disposed to close the vent hole $H_0'$, and is attached by bonding using an adhesive·bonding agent formed into a doughnut shape, a double faced pressure sensitive adhesive tape 91 or the like. Incidentally, in FIG. 14, reference numeral 92 designates a base member laminated on the thin film permeable sheet S' for reinforcement so that it can be easily handled.

By the foregoing method, in the case where the permeable sheet S' is bonded to the vent hole $H_0'$ of the connector casing E', there have been the following problems. (1) Since the permeable sheet not smaller than the size of the vent hole is exposed to the outside, an external object is apt to unexpectedly come in direct contact with the permeable sheet during its handling, using, maintenance, or the like. When a force exceeding a limit is applied as a result of the contact, this permeable sheet is damaged. For example, there is a danger that a pointed end of a screw driver will tear the permeable sheet carelessly to make a hole. (2) It is necessary to carry out the bonding of the permeable sheet by a different step from a molding step of the casing. Since there is a fear that the permeable sheet will be damaged during this bonding operation, excessive attentiveness is required for the bonding operation of the permeable sheet. (3) Since a bonding force is apt to vary by a variation in the amount of adhesive used, or the press force of the permeable sheet, a uniform and stable bonding state is hard to obtain over the whole bonded portion.

An object of the invention is to provide a casing member in which even if an external object is going to come in contact with a permeable sheet by carelessness or the like, a probability that the object comes in direct contact with the permeable sheet is lowered, and there is little danger that the permeable sheet is damaged, and to provide its efficient manufacturing method.

SUMMARY OF THE INVENTION

A first aspect of the invention is that a casing member constituting a casing required to have a sealing property, comprising the casing member, includes a casing member main body provided with, in its own part, a first vent hole passing through the casing in an inward and outward direction and having a predetermined inner diameter size, a gas permeable sheet which has a property to permit permeation of a gas including air, moisture or vapor in the air and to prevent permeation of a liquid and a solid, and is integrally joined to an outside peripheral part of the first vent hole so as to cover the first vent hole from its outside, and a cover member (cover insert member) which is disposed outside the permeable sheet to cover the permeable sheet from its outside and a peripheral part which is hermetically joined to the casing member. The cover member is also provided with a second vent hole in its own inward and outward direction, which has an inner diameter smaller than the first vent hole and connects the first vent hole and an atmosphere of the air through the permeable sheet.

According to the first aspect of the invention, with respect to the inside and the outside of the casing, the first vent hole provided in the casing member main body of the casing member and the second vent hole of the cover member are connected to each other through the permeable sheet covering the whole of the first vent hole, and ventilation of the air and moisture in the air is possible between the inside and the outside of the casing. However, infiltration of a water droplet, an oil droplet, etc. from the outside of the casing to the inside is prevented. Since the second vent hole provided in the cover member is very small as compared with the first vent hole of the casing member main body, even in the case where an object strikes on the casing, it directly strikes on the cover member and hardly strikes on the inside permeable sheet. That is, since the permeable sheet is protected by the cover member disposed at its outside, the damage, such as rupture or peeling, of the permeable sheet can be prevented.

A second aspect of the invention is that in the first aspect of the invention, the cover member includes an anchor part protruding from its outer peripheral edge to the outside, and the anchor part is embedded in the casing member main body.

According to the second aspect of the invention in addition to the effect of the first aspect, the anchor part of the cover member has such an undercut shape as to block the outward extraction, and is embedded in the casing member main body. Thus, even in the case where the casing member main body and the cover member are molded of materials which are hard to mutually bond and weld, it is possible to fix the cover member by causing both to be mechanically engaged with each other.

A third aspect of the invention is that in the first or second aspect of the invention, the second vent hole is a tapered hole having an inner diameter which becomes large from the outside of the casing toward the side of the permeable sheet.

According to the third aspect of the invention, in addition to the effect of the first or second aspect of the invention, even if the diameter of the second vent hole at the outer side of the cover member is small, since the inner diameter at its inner side (that is, at the side contacting the permeable sheet) can be made large, a substantial effective area of the vent hole is enlarged. Even in the state where penetration of an article from the outside into the second vent hole is prevented, a degradation in permeable performance can be suppressed.

A fourth aspect of the invention is that in the first or second aspect of the invention, a clearance hole part for connecting the plural second vent holes is formed inside the cover member.

According to the fourth aspect of the invention, in addition to the effect of the first or second aspect of the invention, since a portion of the permeable sheet required to have a permeable function can be made so as to nearly not come in contact with the cover member by the clearance hole part, the damage of the portion required to have the permeable performance is prevented. Further, the permeable performance can be improved more than the case where the clearance hole part is not provided.

A fifth aspect of the invention is that in the first or second aspect of the invention, a direction of the second vent hole is slanted to a surface of the permeable sheet or is bent halfway.

In general, there often occurs a case where the contact and penetration of an article into the casing from the outside is in a direction vertical to the surface of the casing (that is, the surface of the permeable sheet). According to the fifth aspect of the invention, in addition to the effect of the first or second aspect of the invention, when the second vent hole is slanted to the surface of the permeable sheet or is shaped to be bent halfway, it is possible to effectively prevent the article from penetrating in the second vent hole and making contact.

A sixth aspect of the invention is that in any one of the first to fifth aspects of the invention, the casing member main body and the cover member are joined to each other by bonding or welding.

According to the sixth aspect of the invention, in addition to the effect of any one of the first to fifth aspects of the invention, the airtightness of the joining part between the casing member main body and the cover member is raised, and it is possible to prevent a water droplet from infiltrating into the casing from the joining part.

A seventh aspect of the invention is a method for manufacturing a casing member constituting a casing required to have a sealing property, in which a first vent hole formed in a casing member main body is closed by a permeable sheet and the outside of the permeable sheet is covered with a cover member including a second vent hole having an inner diameter smaller than an inner diameter of the first vent hole. An injection mold is used, which is capable of opening and closing, and includes a cavity with a shape corresponding to the casing member to be molded, and a protrusion having an outer shape smaller than an outer diameter of the permeable sheet in the cavity and which protrudes from one mold surface to the other mold surface. When the injection mold is opened, the cover member and the permeable sheet are set on the one mold surface so that this permeable sheet faces the other mold surface, the mold is tightened, the permeable sheet and the center side of the cover member are held between the protrusion and the other mold surface, and outer peripheral sides of the permeable sheet and the cover member are exposed in the cavity. Next, a molten resin is injected into the cavity to mold the casing member main body having the first vent hole, and the permeable sheet and the cover member are integrated with the casing member main body at the exposed portion.

According to the seventh aspect of the invention, without requiring a subsequent step of bonding, adhesion, welding or the like, at the time of molding the casing member main body as a molded product, the casing member and the permeable sheet can be integrated. Besides, even if the mold is heated by preheating at a high temperature, since the permeable sheet is in contract with the other mold through the cover member and is not in direct contact with the mold, the cover member functions as a heat insulating member, the permeable sheet is protected from heat, and its heat deformation and heat damage can be prevented.

An eighth aspect of the invention is that in the seventh aspect of the invention, at the setting step of the cover member and the permeable sheet, after the cover member is set on the one mold, the permeable sheet is set on the cover member.

According to the eighth aspect of the invention, in addition to the effect of the seventh aspect of the invention, the permeable sheet does not shift with respect to the cover member, and the accuracy of positioning can be raised.

A ninth aspect of the invention is that in the seventh aspect of the invention, in the setting of the cover member and the permeable sheet, a permeable member assembly in which the permeable sheet is previously set on the cover member is set to the one mold.

According to the ninth aspect of the invention, in addition to the effect of the seventh aspect of the invention, since the number of times of setting of the cover member and the permeable sheet may be one, a cycle time of molding can be shortened.

A tenth aspect of the invention is that in any one of the seventh to ninth aspects of the invention, the permeable sheet is one in which a backing sheet having, in irregular directions, countless permeable gaps larger than minute permeable pores provided in a permeable sheet main body is laminated on at least one surface of the permeable sheet main body. The permeable sheet is set to a portion corresponding to the protrusion of the one mold in which the backing sheet faces the protrusion, and molten resin is made to enter at least the gaps of the backing sheet so that the permeable sheet is jointed to a molded product.

According to the tenth aspect of the invention, in addition to the effect of any one of the seventh to ninth aspects of the invention, since the permeable sheet is used in which the backing sheet having the gaps with such a size that the molten resin easily enters is laminated on at least the one surface of the permeable sheet body, joining of the permeable sheet to the molded product main body can be made more certainly. Consequently, stable joining can be obtained. Besides, the one surface of the permeable sheet body is in contact with the molding surface of the mold through the backing sheet, and is not in direct contact therewith. Thus, an unexpected damage of the permeable sheet at the time of closing the mold can be prevented.

An eleventh aspect of the invention is that in any one of the seventh to tenth aspects of the invention, a substantially ring-shaped protrusion is formed at a tip part of the protrusion of the one mold. At the tightening step of the mold, a center part of the permeable sheet is put in a non-contact state by the protrusion, and a rather inside peripheral part of its outer periphery is compressed and held.

According to the eleventh aspect of the invention, in addition to the effect of any one of the seventh to tenth aspects of the invention, at the time of tightening of the mold, the center part of the permeable sheet exhibiting the permeable performance is not in contact with the protrusion of the one mold, and is not compressed, so that the performance of the permeable portion of the center part of the permeable sheet is kept as it is. Thus, it is possible to prevent the original permeable performance of the permeable sheet from being changed.

A twelfth aspect of the invention is that in any one of the seventh to eleventh aspects of the invention, a positioning fitting part where the cover member is set is formed in the other mold. At the set step of the cover member and the permeable sheet, a part of the cover member is fitted and set in the positioning fitting part.

According to the twelfth aspect of the invention, in addition to the effect of any one of the seventh to eleventh aspects of the invention, not only setting of the cover member becomes easy, but the cover member does not move toward a side by resin pressure at the time of injection molding. Therefore, as compared with the case where the positioning fitting part is not provided, the tightening force of the mold can be made small. In the case where the positioning fitting part is not provided, since the movement of the cover member toward the side is restrained by the tightening force, a large tightening force becomes inevitably necessary, and there is a fear that the cover member or the permeable sheet is damaged by this. However, this fear can be eliminated by providing the positioning fitting part to lessen the tightening force.

DETAILED DESCRIPTION OF THE INVENTION

Figure 1:
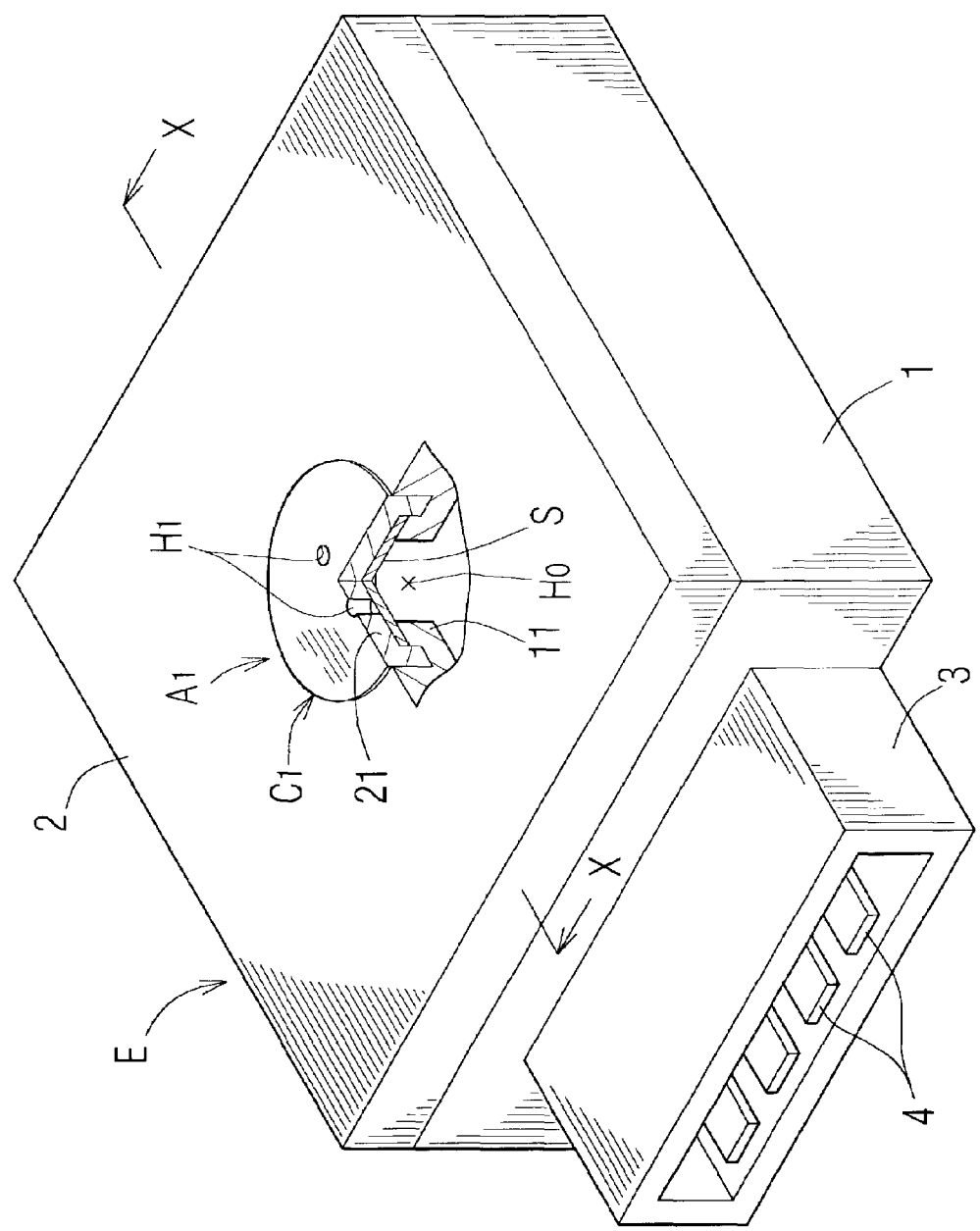
FIG. 1 is a perspective view of a connector casing E using a casing member of a first embodiment.
Figure 2:
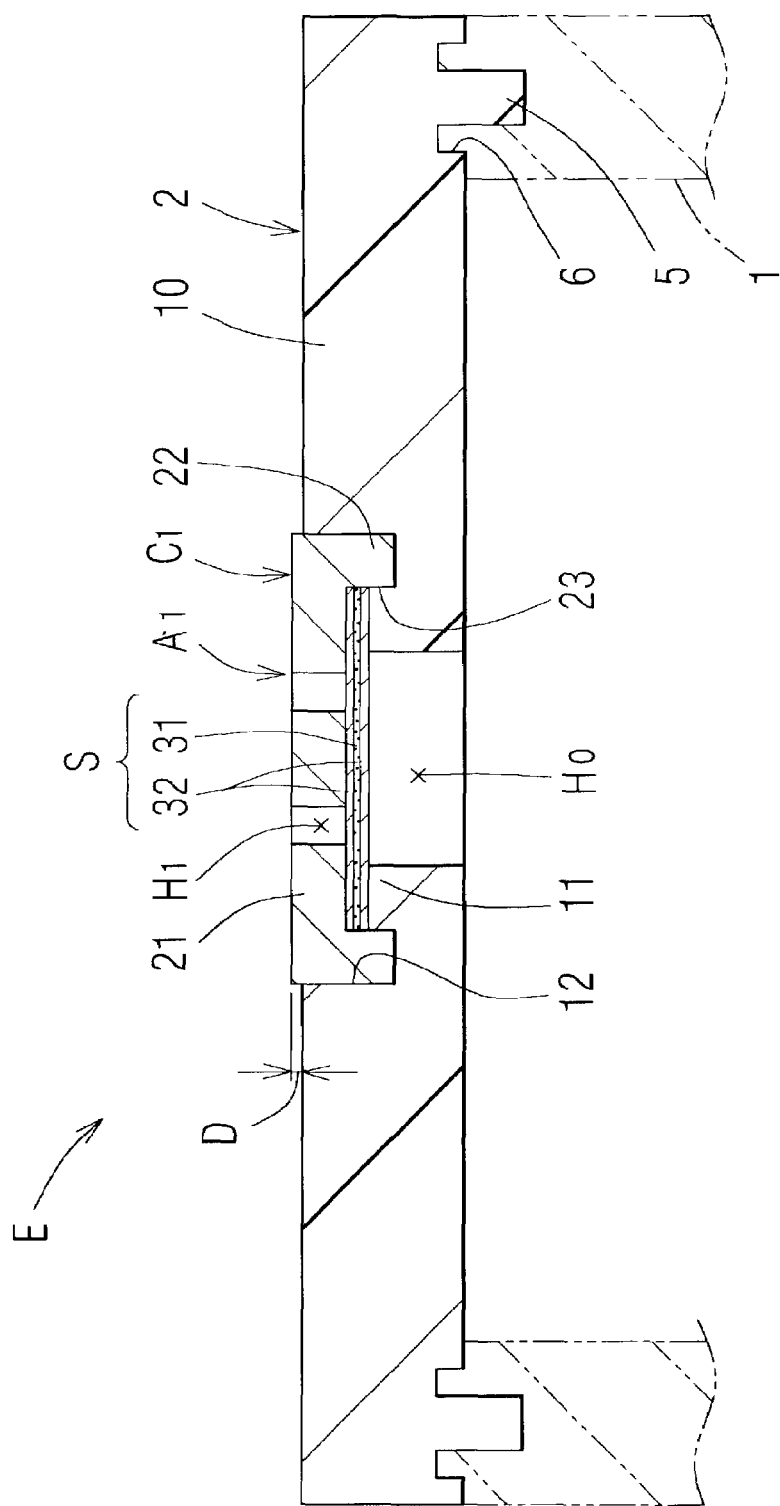
FIG. 2 is a sectional view taken along line X—X of FIG. 1.

Hereinafter, the present invention will be described in more detail by explaining plural embodiments. FIG. 1 is a perspective view of a connector casing E as a casing assembly using a resin casing component member of a first embodiment of the invention, and FIG. 2 is a sectional view taken along line X—X of FIG. 1 and shows a section of a cover 2 as one of component members. With respect to the illustration of a permeable sheet in FIG. 2 or the like, since the illustration is impossible to provide in original size expression, its thickness is considerably enlarged and is illustrated. Moreover, in the case where a permeable sheet appears in both a perspective view of a resin casing and its sectional view, the size of the permeable sheet with respect to the resin casing is neglected and is illustrated.

This connector casing E comprises a casing main body 1 which is one of the component members of the casing assembly and is injection molded out of synthetic resin. The substantially plate-shaped cover 2 which is another one of the component members of the casing assembly, is injection molded, and is fitted to the casing main body 1 in a sealed state. A box-shaped socket part 3 is integrally molded on one side of the casing main body 1, and metal terminals 4 electrically connected to equipment housed in the inside of the casing main body 1 are partially embedded in the socket part 3. A portion of the metal terminals 4 protrudes from a side wall of the casing main body 1, and this protrusion is housed in the socket part 3. The cover 2 comprises a cover main body 10 and a permeable member $A_1$ covering the outside of an after-mentioned large vent hole (first vent hole) $H_0$ formed therein. The permeable member $A_1$ allows ventilation between the inside and outside of the connector casing E, and comprises a gas permeable sheet S and a cover insert member $C_1$ disposed outside of sheet S to protect it. Permeable member $A_1$ is joined to the cover main body 10 at an outer peripheral part of the permeable sheet S in an airtight state. Incidentally, in FIGS. 1 and 2, equipment such as a microcomputer housed inside of the casing main body 1 is not shown. In the invention, although the portion of the cover main body 10 of the casing component member (cover 2) provided with the permeable sheet is made of resin, a material of another casing component member (equivalent to the casing main body 1 in this embodiment) which constitutes the casing assembly (connector casing E) and is not provided with the permeable sheet is not limited to resin, but a press molded product of a metal plate or a mold casting molded product of light alloy may be adopted.

A fitting projection part 5 to be fitted to a peripheral part of the casing main body 1 as the other casing component member is protrusively provided on an outer peripheral back surface of the cover 2. A fitting recess part 6 for ensuring the fitting and increasing the sealing property is formed at the periphery of the fitting projection part 5. This cover 2 is attached to hold airtightness in such a manner that after necessary equipment is mounted in the casing main body 1, the fitting projection part 5 and the fitting recess part 6 are fitted to the peripheral part of the casing main body 1, and a liquid sealant or the like serving as an adhesive and having a water proof property is used over all the periphery, so that water droplets, dust or the like does not enter through the portion. Alternatively, the cover is similarly attached by welding or the like to hold airtightness.

A sheet joining part 11 which is formed at an almost center part of the cover main body 10 and to which the permeable sheet S is joined, is formed to be recessed toward the rear side (inside of the casing) as compared with an outer surface of the main body 10, and the circular large vent hole $H_0$ is formed through the cover main body 10 between the front and the back (outward and inward direction of the casing). An annular integrated part (i.e., cover insert member receiving recess) 12 recessed toward the back side of the cover main body 10 is formed in the main body 10 at the outer peripheral side of the sheet joining part 11. The integrated part 12 is a portion where, when the cover 2 is formed by an after-mentioned injection molding method, an annular protrusion 22 of the cover insert member $C_1$ is integrally embedded in the cover main body 10. The circular permeable sheet S has an outer diameter larger than an inner diameter of the large vent hole $H_0$, and is joined to the front side (outside of the casing) of the sheet joining part 11 which is the outer peripheral side of the large vent hole $H_0$ in a radius direction to close the large vent hole $H_0$. The permeable sheet S is disposed and joined to the sheet joining part 11 hollowed from the surface of the cover main body 10 as stated above so that the cover insert member $C_1$ can be laminated with the sheet joining part 11 which is the recess portion of the cover main body 10, whereby the cover insert member $C_1$ covers the surface of the permeable sheet S. By this, a structure is realized in which a chance that the permeable sheet S will come in contact with an external object during the manufacture of the cover 2, its handling, the use of the casing, or the like is decreased, and damage is prevented.

With respect to the cover insert member C1, the annular protrusion 22 is integrally formed on a back surface outer peripheral part of a disk-like main body portion (i.e., main portion) 21 to protrude in a thickness direction (i.e., the annular protrusion 22 protrudes from the main body portion 21 in the thickness direction of the body portion 21). A space formed by the back surface of the main body part 21 and the inner peripheral surface of the annular protrusion 22 is a receiving recess part (i.e., permeable sheet receiving recess) 23 for the permeable sheet S. At the time of injection molding the cover 2, the cover insert member C1 receives the permeable sheet S in the permeable sheet receiving recess 23, and the permeable sheet S is in contact with the back face of the main body portion (main portion) 21. The annular protrusion 22 is integrally embedded around the outer peripheral portion of the large vent hole H0 in the cover main body 10, and the outer peripheral annular portion of the permeable sheet S is joined to the sheet joining part 11 provided outside the large vent hole $H_0$ of the cover main body 10 to hold airtightness. The permeable sheet S is held between the sheet joining part 11 of the cover main body 10 and the main body part 21 of the cover insert member $C_1$. As illustrated in FIG. 2, the annular protrusion 22 is located within the cover insert member receiving recess 12. When the cover insert member $C_1$ is embedded (inserted) in the cover main body 10, the respective centers of the large vent hole $H_0$ of the cover main body 10, the permeable sheet S and the cover insert member $C_1$ are coincident with each other. When the cover insert member $C_1$ is embedded in the cover main body 10, the top (outer portion) of the cover member $C_1$ protrudes from the surface of the cover main body 10 by a slight length D, and a slight step is formed between the surfaces. However, this step is for enabling accurate molding at the time of the after-mentioned injection molding, and the molding can also be performed so as not to form the step.

Two small vent holes $H_1$, each being smaller in cross-sectional area than the large vent hole $H_0$ of the cover main body 10, are provided at the center part of the main body part 21 of the cover insert member $C_1$. The two small vent holes (second vent holes) $H_1$ are cylindrical holes, are disposed to be symmetrical with respect to the center of the cover member $C_1$, and are formed parallel with the thickness direction of the cover insert member $C_1$, (that is, perpendicularly to the surface of the permeable sheet S) to pierce through the cover insert member from the front to the back. The number of small vent holes $H_1$ and their size may be suitably selected and determined in accordance with required permeable performance. In the state where the cover insert member $C_1$ covers the permeable sheet S and is integrally joined to the outer peripheral side of the sheet joining part 11 of the cover main body 10, an opening inside the two small vent holes $H_1$ is formed at a position within the range of the permeable sheet S, preferably within the range of the large vent hole $H_0$ formed in the cover main body 10. Thus, the small vent holes $H_1$ and the large vent hole $H_0$ are formed to communicate with each other so that gas such as air moisture or water vapor can flow through the permeable sheet S. Thus, when the permeable sheet S is used on the connector casing E, the inside and outside pressures can be kept equal to each other. Incidentally, in the connector casing E of this embodiment, although the large vent hole $H_0$ is formed in the cover main body 10 as one of the casing component members, it may be formed in the casing main body 1 as the other casing component member or in both the casing component members, and its formation position is optional according to a use.

The permeable sheet S is formed to have a thin disk like shape, and in the first embodiment, as shown in FIG. 2, it is a sheet having a structure in which backing sheets 32 are laminated on both surfaces of a permeable sheet main body 31 by pressure welding or the like. As the permeable sheet main body 31, "Gore-Tex", trade name, of W. L. Gore & Associates of US, "Microtex", trade name, of Nitto Denko Corporation, or the like can be suitably used. The material of any of the above permeable sheet main bodies is polytetrafluoroethylene resin, the permeable sheet main body 31 has a thickness of 50 µm to 200 µm according to a desired use, and can be suitably selected and used.

The permeable sheet main body 31 is almost spongy when viewed microscopically, and includes therein countless minute pores 33 having a size of about 0.05 µm to 20 µm and an irregular shape. Thus, the permeable sheet S has such performance that, although moisture or water vapor having a size of 0.0004 µm in the air and atmospheric gas (nitrogen gas, oxygen gas) are allowed to pass through, a liquid such as a water droplet having a size of 100 µm (corresponding to approximately a size of a drizzle) or an oil droplet, and a solid foreign substance, such as dust, are prevented from passing through.

As the material of the backing sheet 32 laminated on the permeable sheet main body 31, a fabric or an unwoven fabric made of fibers of each resin of polyamide, polyester, polyolefin and the like does not corrode and does not dissolve or deteriorate even when it comes in contact with water. Accordingly, it is suitable. Besides, the thickness of the backing sheet may be such that in a case where laminating is performed to include the permeable sheet main body 31, the thickness of the whole permeable sheet S becomes 50 µm to 500 µm. Here, a thickness of about 100 µm to 300 µm is suitable for the permeable sheet S in view of handling at the time of injection molding. Countless permeable gaps 34 having irregular shapes are also formed in the inside of the backing sheet 32.

Any type of resin can be used for the injection molding of the cover 2 of the invention, as long as the performance requested for the resin casing is satisfied, and as long as it is a thermoplastic resin or a thermosetting resin which is melted into a liquid by heating. Especially, in the case where the cover 2 is a casing member of a casing assembly, like the connector casing E, for housing equipment therein, since relatively high rigidity is required, it is preferable to use a hard thermoplastic synthetic resin as set forth below. A thermoplastic resin which is melted into a liquid when it is heated, for example, ABS (acrylonitrile butadiene styrene) resin, AES (acrylonitrile ethylene-propylene rubber styrene) resin, PVC (polyvinyl chloride) resin, PP (polypropylene) resin, PE (polyethylene) resin, PA (polyamide) resin, PPS (polyphenylene sulfide) resin, PBT (polybutylene terephthalate) resin, POM (polyacetal) resin or the like can be named. On the other hand, although the material of the cover insert member $C_1$ is not particularly limited as long as it has such strength as not to damage the permeable sheet S even if an external object comes in contact, a hard synthetic resin having heat conductivity smaller than metal is preferable. In addition, the number of small vent holes $H_1$ formed in the cover insert member $C_1$ is not limited as long as requested permeable performance is satisfied.

Figure 3:
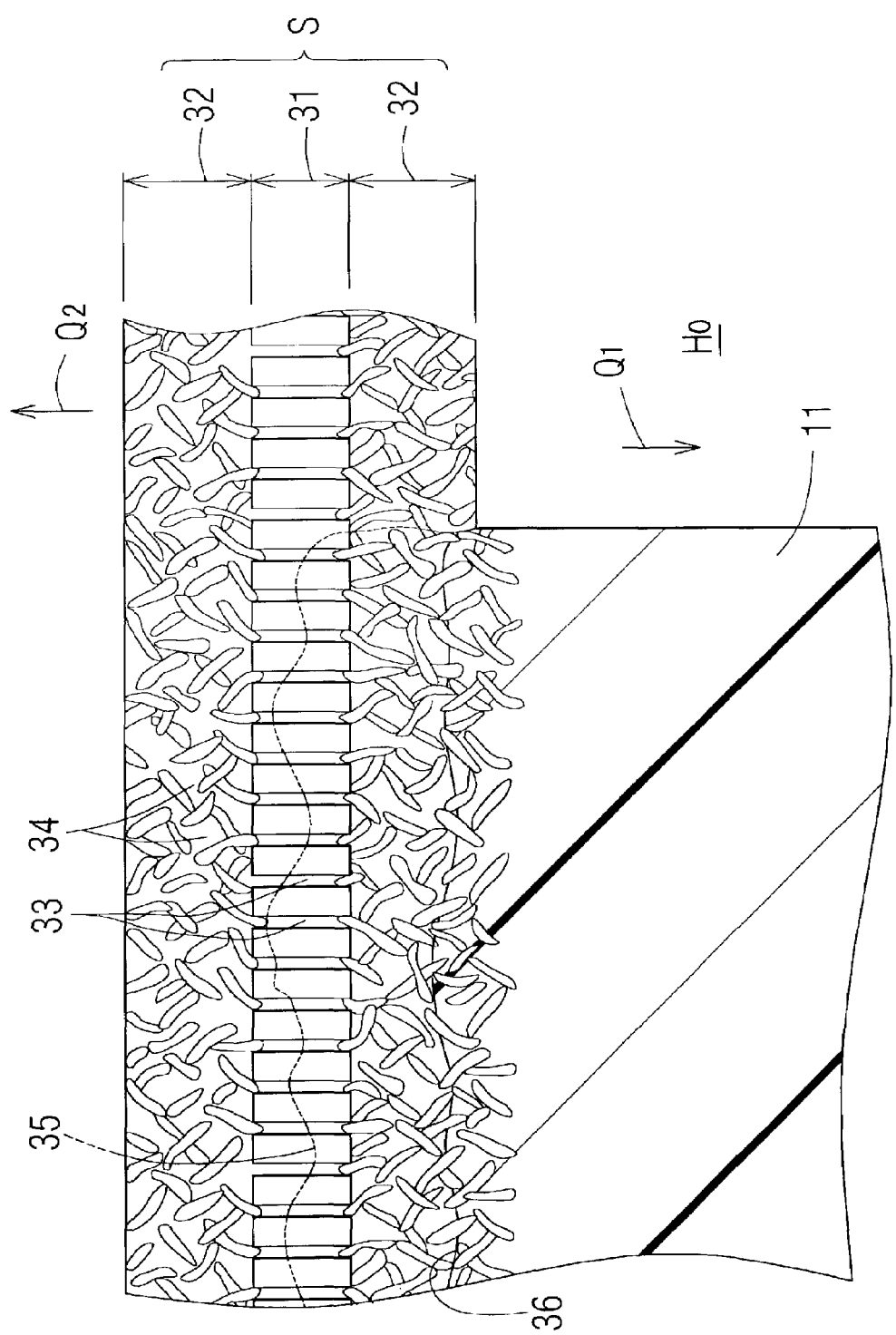
FIG. 3 is an enlarged schematic sectional view showing a joining state of a permeable sheet S to a sheet joining part 11 of a cover main body 10.

Besides, the permeable sheet S is joined to the sheet joining part 11 of the cover main body 10 mainly by mechanical fixing, and FIG. 3 shows an enlarged schematic view of the joining state. FIG. 3 is a schematic view showing the joining state of the permeable sheet S to the joining part (sheet joining part 11) of the molded product (cover main body 10). In FIG. 3, $Q_1$ denotes a ventilation direction from the outside of the casing to the inside, and $Q_2$ denotes a ventilation direction from the inside of the casing to the outside. Although the minute pores 33 formed in the permeable sheet main body 31 are simplified and shown only in the thickness direction of the permeable sheet S in order to distinguish them from the backing sheet 32 and to enable illustration, the shapes do not actually have directionality and are formed in irregular directions. In the permeable sheet main body 31, the countless minute pores 33 having sizes (about 0.01 µm to 20 µm) and irregular shapes are formed, and many gaps 34 (hereinafter referred to as "gaps") larger than the minute pores 33 of the permeable sheet main body 31 and having permeability are formed in the backing sheets 32 laminated on both surfaces of the permeable sheet main body 31. Thus, the permeable sheet 31 and the backing sheets 32 have a permeable structure, and are formed of the above materials.

As shown in the schematic view of FIG. 3, at the time of injection molding, the resin of the sheet joining part 11 forming the outer peripheral part of the large vent hole $H_0$ of the molded product at least partially enters or bites into the irregular gaps 34 of the backing sheet 32 laminated on the back side of the molded product in the permeable sheet main body 31. More preferably, the resin enters or bites into the irregular minute pores 33 of the permeable sheet main body 31 through the whole thickness of the backing sheet 32 laminated on the back side (see a broken line part 35 and a solid line part 36 of FIG. 3). The biting of this resin is such that when molding is performed by an after-mentioned injection molding process, a heated molten liquid resin is filled in a cavity of a mold F for a molded product, and is forcibly pressed into the gaps 34 by the action of a resin injection pressure and filling pressure of hundreds to tens of thousands Newton per cm. At an annular joining part 11 of the molded product and the permeable sheet S, an anchor effect is caused by solidification of the resin which enters and bites into the irregular gaps 34 of almost all the area by the above action. Thus, the permeable sheet S is firmly joined (fixed) to the annular sheet joining part 11 formed along the outer periphery of the large vent hole $H_0$.

At the portion of the permeable sheet S corresponding to the joining part, the backing sheets 32 laminated on both the surfaces of the permeable sheet main body 31 receive the injection pressure and filling pressure at the time of the injection molding, so that they are compressed in the thickness direction and the thickness is somewhat decreased from the original thickness (thickness in the natural state). Then, the sizes of the gaps 34 and the minute pores 33 in the inside are compressed in the thickness direction, and become smaller than those in the natural state (state in which the injection pressure and the filling pressure are not applied). This means that the permeable sheet main body 31 and the backing sheets 32 at the portion corresponding to the joining part receive large resistance as compared with the other portions when gas such as air or moisture in the air passes through in any direction. In other words, the permeability is lowered, the permeation resistance is raised, the gas permeation becomes difficult, and the sealing property becomes high.

In this way, at the joining part, the resin enters and bites into at least the gaps 34 of the backing sheet 32 at the back side of the cover main body 10, and the permeable sheet S is firmly fixed to the sheet joining part 11 at the outer peripheral side of the large vent hole $H_0$, and the permeation resistance of the portion becomes high as compared with the other portion. Accordingly, even in the case where the resin does not enter into all of the gaps 34 of the backing sheet 32 in the thickness direction at the portion corresponding to the joining part (that is, the gaps 34 into which the resin does not enter remain), the permeation of a water droplet or the like is suppressed in this portion, and the sealing property at the joining part is improved as compared with the other portion. The backing sheet 32 is somewhat compressed in the thickness direction by the compression caused by a mold at the time of after-mentioned injection molding and also becomes dense in the inner peripheral annular portion relative to the joining part. Thus, in relation to the minute pores 33, the inner gaps 34 become smaller than those in the natural state, and as compared with the center portion (portion closing the large vent hole $H_0$ of the cover main body 10) in the natural state, the permeation resistance is raised. As a result, the sealing property is improved.

The permeable sheet main body 31 may be singly used (i.e., used alone). In this case, at the time of the injection molding of the cover 2, due to the injection pressure and filling pressure, both the cover and sheet are firmly fixed such that heated molten liquid resin partially enters the minute pores 33 of the permeable sheet main body 31. Thus, the joining force (fixing force) of the permeable sheet main body 31 at the sheet joining part 11 of the cover main body 10 is raised, and the sealing property at the joining part is also improved. As stated above, in the case where the permeable sheet main body 31 is singly used as the permeable sheet, since the performance of the portion closing the large vent hole $H_0$ in the permeable sheet main body 31 is not changed, the permeable performance of the permeable sheet main body 31 is not changed, and the cover 2 having the permeable performance as previously set can be obtained. In any of the above examples, in the case where a water droplet or an oil droplet is apt to adhere according to the use place, it is further desirable if forming of a water-repellent and oil-repellent film on the surface of the permeable sheet main body 31 and/or the backing sheet 32 is previously carried out.

Figure 4:
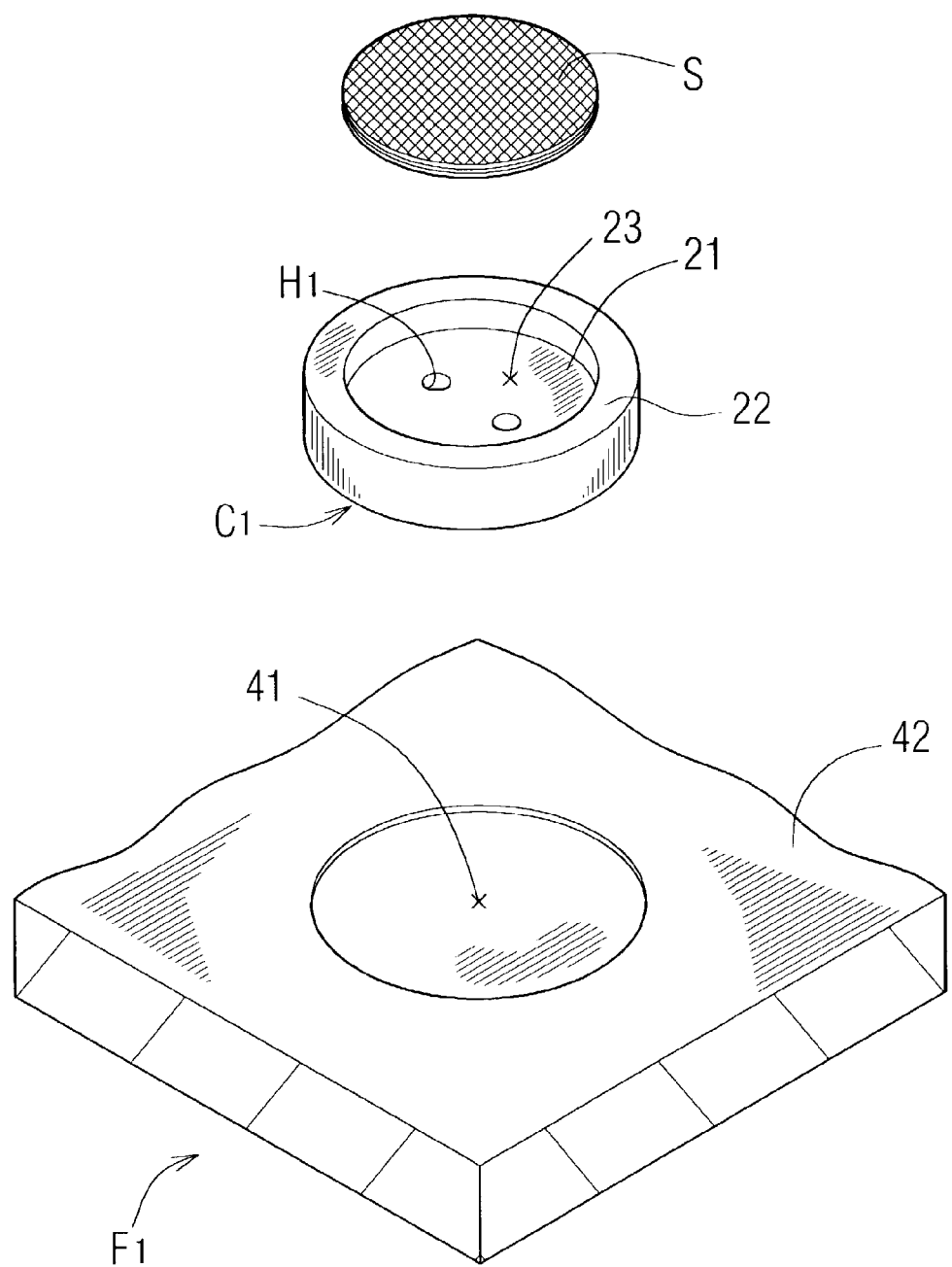
FIG. 4 is a perspective view showing a step of setting a permeable member $A_1$ to a mold F of the invention.
Figure 5:
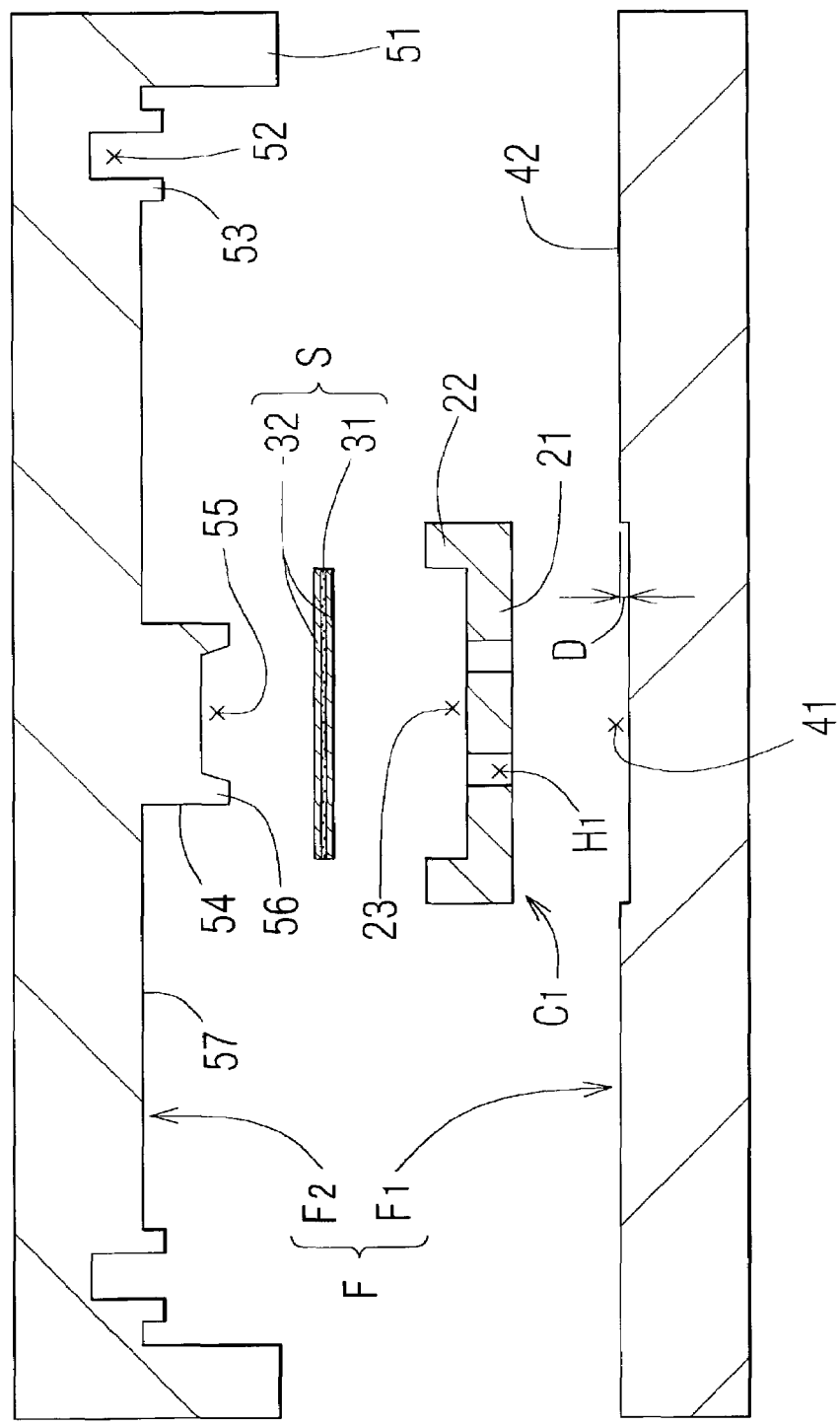
FIG. 5 is a sectional view of a state where the mold F is opened to mold a cover 2.
Figure 6:
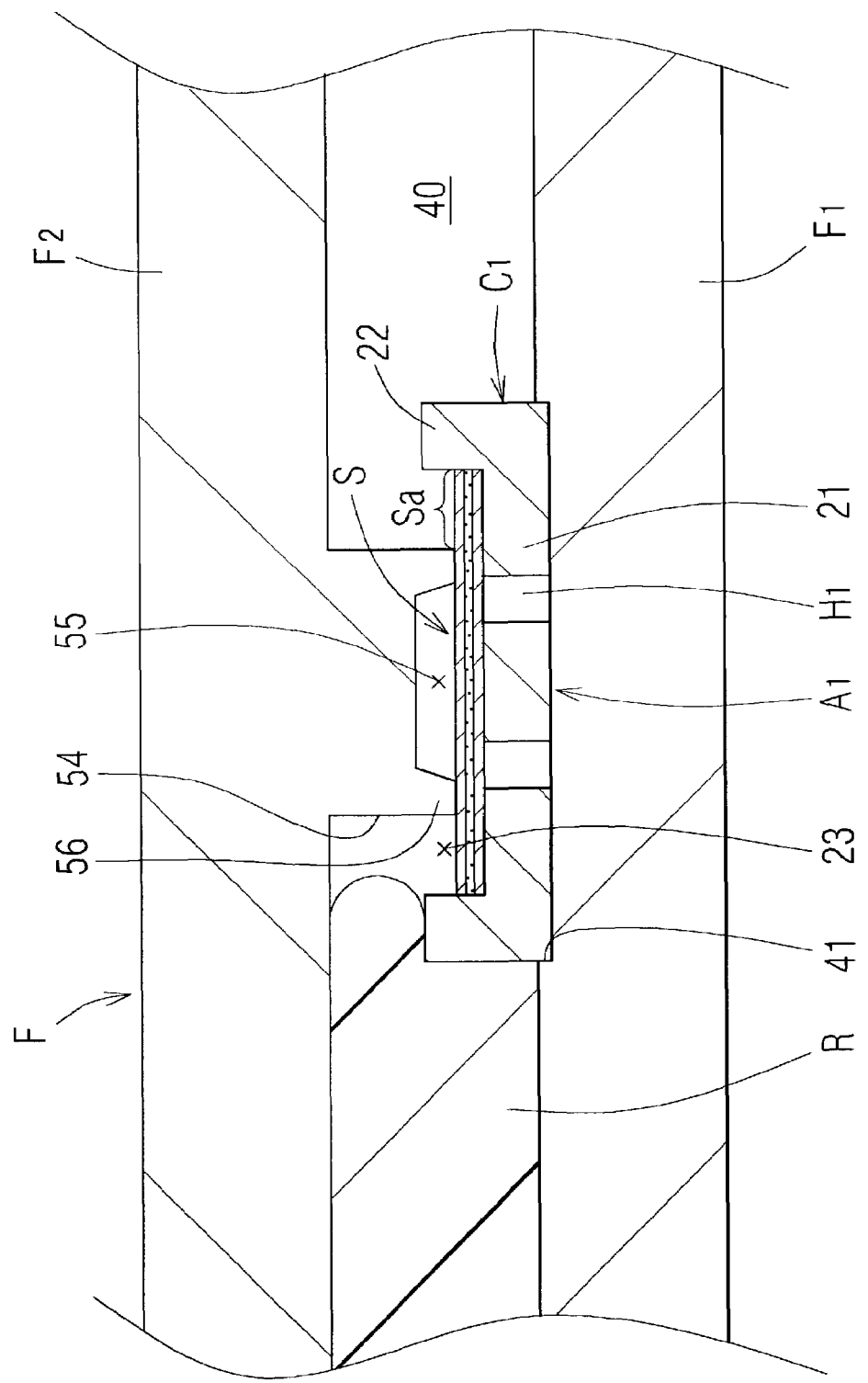
FIG. 6 is a sectional view of a state in which the mold F is closed and injection molding is performed.
Figure 7:
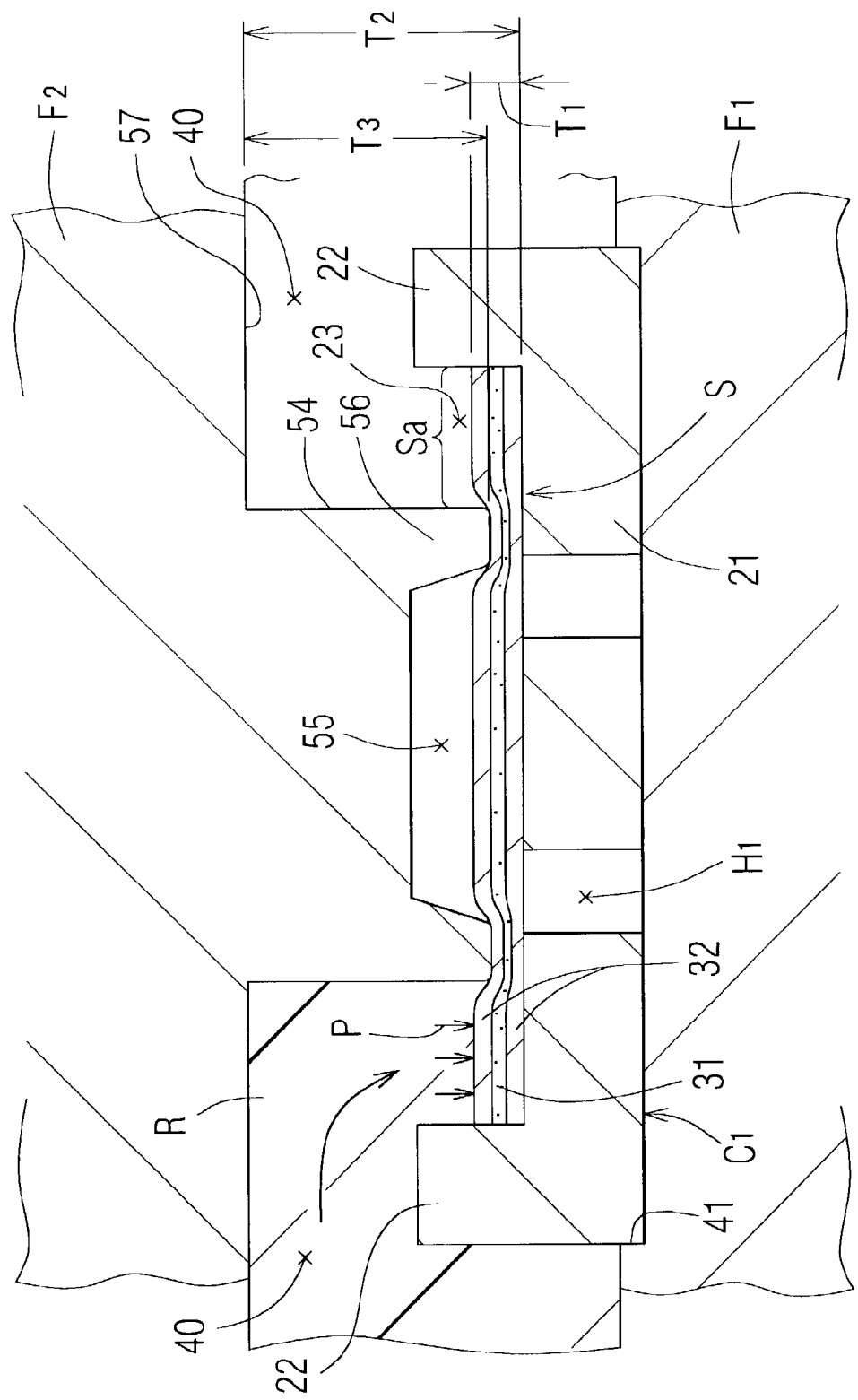
FIG. 7 is an enlarged view of a main part (a portion of the permeable sheet S) of FIG. 6.

Subsequently, a method of manufacturing the cover 2 as the member constituting the connector casing E by injection molding will be described. FIG. 4 is a perspective view showing a step of setting the permeable member $A_1$ in a mold F of the invention, FIG. 5 is a sectional view of a state in which the mold F of the invention is opened, FIG. 6 is a sectional view of a state in which the same is closed, and FIG. 7 is an enlarged view of a main part (portion of the permeable sheet S) of FIG. 6. At first, the mold F will be described, and then the method of manufacturing the cover 2 as the molded product by using this mold F and by the injection molding will be described.

The mold F is composed of a cavity mold $F_1$ for molding a front side of the cover 2 and a core mold $F_2$ moving to open and close this and shaping the back side of the cover 2, and both of them are made of steel. The cavity mold $F_1$ is a substantially plate-shaped mold, and a circular positioning recess part 41 is formed at the center part of a cavity mold surface 42 for molding the surface of the cover 2. The positioning recess part 41 is a portion for setting and fixing the previously separately formed cover insert member $C_1$ to the cavity mold $F_1$, and is formed to be lower than the cavity mold surface 42 as the molding surface by a depth D. In the foregoing finished product of the cover 2, the step formed between the surface of the cover main body 10 and the surface of the cover insert member $C_1$ is formed to correspond to the depth D of the positioning recess part 41.

On the other hand, at an outer peripheral part of the core mold $F_2$ for forming the back side of the cover 2, a projection part 51 acts as a division surface of both the molds, and is formed so as to surround a cavity 40 by the whole periphery. An annular recess part 52 and an annular projection part 53 for forming the fitting projection part 5 and the fitting recess part 6 of the cover main body 10 are formed at the inside thereof. A large vent hole forming protrusion 54 for forming the large vent hole $H_0$ of the cover main body 10 is integrally provided at the center part, and a tip surface of the large vent hole forming protrusion 54 is disposed opposite to the positioning recess 41 of the cavity mold $F_1$ almost concentrically. A tray-shaped recess part 55 is formed at the tip surface of the large vent hole forming protrusion 54, so that an annular projection part 56 is formed at the tip surface of the large vent hole forming protrusion 54. The recess part 55 is a portion formed concentrically with the tip surface of the large vent hole forming protrusion 54 so that a portion of the center part of the permeable sheet S exhibiting the permeable function and opposite to the tip surface of the large vent hole forming protrusion 54 is not excessively compressed at the time of tightening against the tip surface of the large vent hole forming protrusion 54, and is preferably put in a non-contact state. In FIG. 5, reference numeral 57 denotes a core mold surface as a molding surface for forming the back of the cover 2.

Then, the cover 2 is manufactured by using the above mold F in a manner as set forth below. First, a permeable member set step of setting a permeable member assembly in the cavity mold $F_1$ will be described. The permeable member assembly is the cover insert member $C_1$ in which the small vent holes $H_1$ are previously formed and the permeable sheet S is received in the receiving recess part 23. Since the inner diameter of the receiving recess part 23 is slightly larger than the outer diameter of the permeable sheet S, in the set state, the permeable sheet S can be set while its outer peripheral part is not deformed, and the permeable sheet S can be set without causing position shift. Since the permeable sheet S has the structure in which the backing sheets 32 are laminated on both surfaces of the permeable sheet main body 31, and the whole shape is a disk like shape, there is no restriction in both the front and back and the directionality in the set state. Accordingly, the set operation for the permeable sheet S is easy. The permeable member assembly is set to the cavity mold $F_1$ in this way, so that the set step of both the members of the cover insert member $C_1$ and the permeable sheet S can be carried out at the same time. Accordingly, as compared with the case where the permeable sheet S is singly set, the set operation is easy and can be accurately carried out.

With respect to the set state of the permeable member assembly, since the outer peripheral part of the cover insert member $C_1$ is fitted in the positioning recess part 41 of the cavity mold $F_1$ and is mechanically fixed, even if the flow force of molten resin at the time of injection molding is applied to the cover member $C_1$, molding can be performed without a position shift while an accurate position is kept. In the case where the positioning recess part 41 is provided, the position shift can be easily prevented, and it is not necessary to increase a tightening force to tighten the mold firmly, so that the injection molding can be performed by a small tightening force. Thus, by providing the positioning recess part 41, it is possible to decrease a fear of damage of the cover insert member $C_1$ and the permeable sheet S due to a large tightening force. Incidentally, with respect to the positioning and fixing of the cover insert member $C_1$, a pin (not shown) protruding from the cavity mold surface 42 of the cavity mold $F_1$ to the side of the core mold $F_2$ is provided, and fixing can be performed by fitting this pin in the hole of the small vent holes $H_1$ or another formed hole. In this case, the positioning recess part 41 is not necessarily needed.

Next, a permeable member holding step will be described in which after the permeable member set step, the core mold $F_2$ is made to approach the cavity mold $F_1$, and the mold F is closed. As shown in FIG. 6, the permeable member $A_1$ (the permeable member assembly) is held and fixed between the positioning recess part 41 of the cavity mold $F_1$ and the annular projection part 56 of the large vent hole forming protrusion 54 of the core mold $F_2$, and a space formed by the cavity mold $F_1$, the core mold $F_2$, and the a part of permeable member $A_1$ forms the cavity (molding space) 40. That is, the bottom of the positioning recess part 41 of the cavity mold $F_1$ is in contact with the whole surface of the main body part 21 of the cover member $C_1$ of the permeable member $A_1$, the permeable sheet S is received at the bottom of the receiving recess part 23 of the cover member $C_1$, and the center portion of the permeable sheet S is in contact with the annular projection part 56 provided at the tip of the large vent hole forming protrusion 54 of the core mold $F_2$. Since the outer shape of the large vent hole forming protrusion 54 of the core mold $F_2$ is smaller than the outer shape of the permeable sheet S, in the held state of the permeable member $A_1$, the outer peripheral part of the permeable sheet S outside the large vent hole forming protrusion 54 and the annular protrusion 22 of the cover member $C_1$ are annular and are exposed in the cavity 40. An exposed portion Sa of the permeable sheet S and the annular protrusion 22 are portion integrally joined to the sheet joining part 11 of the cover main body 10 and the integrated part 12 after the molding.

In the case where the center part of the permeable sheet S is held by the tip of the large vent hole forming protrusion 54 of the core mold $F_2$ in the manner described above, although a structure may be adopted in which it is held by the whole surface of the tip surface of the large vent hole forming protrusion 54, as in the above structure, when the recess part 55 is formed at the tip surface of the large vent hole forming protrusion 54 and the annular projection part 56 is formed at its peripheral part, the center part of the permeable sheet S can be made a portion which is not compressed. That is, since the circular portion of the permeable sheet S at the inside of the annular projection part 56 does not come in contact with the core mold $F_2$ and is not compressed, the natural state of the permeable sheet S can be kept. As a result, the permeable sheet S, which becomes a permeable portion together with the large vent hole $H_0$ and the small vent holes $H_1$, is not compressed, and the original permeable function is performed. Further, since the permeable sheet S is compressed somewhat in the thickness direction by the annular projection part 56 of the core mold $F_2$ and is annularly held, the contact between the permeable sheet S and the annular projection part 56 become certain. Thus, the seal property between the permeable sheet S and the annular projection part 56 is raised at the compressed portion, and it is possible to prevent molten resin from entering the gap (space) portion at the inside of the permeable sheet S and the annular projection part 56.

According to the kind of resin used at the time of the injection molding of the molded product, it is necessary to perform the injection molding in a state where the temperature of the mold F is kept at a high temperature (for example, in the case where polyphenylene sulfide resin is used as the molding material, the temperature of the mold F is a temperature of 130° C. or higher). In this case, the permeable sheet main body 31 of the permeable sheet S set in the mold F is heated by conductive heat, radiation heat or the like from the mold F, and there is a fear that heat deformation or performance deterioration by heat occurs. However, even if the mold F is heated by preheating up to a high temperature, the surface of the permeable sheet S is disposed in the cavity mold $F_1$ through the cover member $C_1$, and is set in a state where it does not come in direct contact with the high temperature cavity mold $F_1$. Thus, the cover member $C_1$ functions as a heat insulating member to protect the permeable sheet S against heat, the heat deformation and heat deterioration is prevented, and the permeable performance of the main body 31 of the permeable sheet S can be kept. When the cover member is formed of a synthetic resin material having lower heat conductivity lower than metal, the foregoing effect is remarkably exhibited.

On the other hand, in the core mold $F_2$, the recess part 55 is formed at the tip surface of the large vent hole forming protrusion 54 which does not contact the center part of the back of the permeable sheet S, and the non-contact portion between the permeable sheet S and the core mold $F_2$ is formed. By such structure, since the whole front surface of the permeable sheet S and the center part of the back do not come in contact with the mold F, it is possible to further decrease the danger that heat deformation or heat deterioration will occur.

Further, as shown in FIG. 7, it is preferable to realize a structure in which at the portion where the permeable sheet S is held between both the molds $F_1$, $F_2$ and the cover insert member $C_1$, the permeable sheet S is somewhat compressed in the thickness direction. That is, when the thickness of the permeable sheet S in the natural state (state where it is not compressed) is made $T_1$, the distance between the core mold surface 57 of the core mold $F_2$ in the state where the mold is closed and the bottom of the receiving recess part 23 of the cover insert member $C_1$ set in the cavity mold $F_1$ is $T_2$, and the height (protruding length) of the large vent hole forming protrusion 54 of the core mold $F_2$ is made T3, the relationship of $T_3 > (T_2 - T_1)$ is established. By doing so, the permeable sheet S held between the annular projection part 56 of the core mold $F_2$ and the bottom of the receiving recess 23 of the cover member $C_1$ set in the cavity mold $F_1$ can be somewhat compressed in the thickness direction. With respect to the amount of compression of this permeable sheet S, such compression as to bite off the permeable sheet S at the time of tightening is avoided, and a desirable amount of compression is almost proportional to the ratio of an occupied space to the permeable sheet S in its thickness direction. When the thickness in the natural state is made 100, its level is such that the thickness after compression falls within the range of 90 to 20.

By this, in the permeable sheet S, the minute pores 33 and/or the permeable gaps 34 are collapsed at the compressed portion, and the size becomes small, so that the ratio of the occupied space becomes small. Thus, since the permeable sheet S becomes locally dense, the permeation resistance to a fluid, that is, the sealing property is raised. In the case where molten resin is filled into the cavity 40, it is possible to satisfactorily prevent the molten resin from flowing into the inside of the annular projection part 56 across the tip of the large vent hole forming protrusion 54, in other word, flush can be avoided on the permeable sheet S. As a result, the molten resin is prevented from flowing into the portion performing the permeable function in the permeable sheet S (portion closing the vent hole in the molded product), and the effective area of the permeable sheet S to perform the permeable function is not decreased, which leads to the excellent permeable performance.

Next, an injection molding step will be described. As molding conditions, an example will be given in which the cover insert member $C_1$ is formed of the same material as the cover main body 10 and separately therefrom in advance, PBT resin mixed with glass fiber of 30 to 45 wt. % is used as a material resin of the cover main body 10, and unwoven fabric of PET resin fibers is used as a material resin of the backing sheet 32 of the permeable sheet S. The temperature of molten resin is 240° C., and the temperature of the mold F is kept at 60 to 80° C. First, high temperature liquid molten resin R injected into the cavity 40 through an injection gate (not shown) from an injection nozzle (not shown) outside the mold F sequentially fills the left half of the cavity 40 in FIG. 6 and flows to the right. Then, it further flows to the right, and when it collides against the annular protrusion 22 of the cover insert member $C_1$, the flow direction is changed upward (direction of the core mold $F_2$) on the paper plane of FIG. 6, goes over the tip of the annular protrusion 22, and flows into the receiving recess part 23 of the cover member $C_1$ in the cavity 40. Although the molten resin R flowing into the housing projection part 23 of the cover member $C_1$ comes in contact with the exposed portion Sa of the permeable sheet S, since this permeable sheet S is made of resin having heat conductivity extremely lower than the steel mold F, even if the molten resin R comes in contact with the permeable sheet S, it is not immediately solidified.

The molten resin R is sequentially supplied from the injection gate, and in the state where the cavity 40 of the mold F is completely filled with the molten resin R, the procedure proceeds to a pressure keeping step. A predetermined pressure (pressure keeping) is continuously applied so that the pressure of the resin filled in the cavity 40 does not lower.

In this pressure keeping state, at the portion where the cover insert member $C_1$ is in contact with the molten resin R, in order to fix the cover insert member $C_1$ to the injection molded portion (cover main body 10) to integrate them, the molten resin R surrounds the annular protrusion 22 and is welded to the portion. On the other hand, in the portion where the permeable sheet S is in contact with the molten resin R, by the action of the injection molding pressure and/or the pressure keeping force, part of the molten resin R in contact with the permeable sheet S flows into the countless gaps 34 of the backing sheet 32 of the back side of the permeable sheet S, and preferably flows into the minute pores 33 of the permeable sheet S as well. In this state, with respect to the exposed portion Sa of the permeable sheet S, by pressure P of the molten resin R in contact with the portion, the whole of the exposed portion Sa is compressed in the thickness direction by the substantially uniform pressure and is continuously pressed to the bottom of the receiving recess part 23 of the cover insert member $C_1$ (see FIG. 7). By this liquid pressure action, the molten resin R almost uniformly enters the gaps 34 over the whole of the backing sheet 32 of at least the exposed portion Sa.

The countless gaps 34 formed in the backing sheet 32 are directed in irregular directions as set forth above. As a result, as shown in FIG. 3, the resin directed in countless irregular directions enter the countless gaps 34 in every direction. Then, when the resin is solidified in this state, the resin forming the sheet joining part 11 of the cover main body 10 and the permeable sheet S are firmly joined (fixed) by the anchor effect of the gaps of the backing sheet 32 and the resin. It is appropriate that part of the molten resin R entering the countless gaps 34 of the backing sheet 32 goes across the backing sheet 32 and enters the minute pores 33 of the permeable sheet main body 31 as well. Particularly, when resin having a low viscosity in a molten state is used, since the fluidity is high, the resin can enter the minute pores 33, and the joining (fixing) becomes more certain.

The backing sheet 32 is heated by the heat of the molten resin R up to the heat deformation temperature or higher, is somewhat softened, is apt to be deformed, and is solidified in the state where the whole exposed portion is pressed to the bottom of the receiving recess part 23 of the cover insert member $C_1$ uniformly and is compressed. Therefore, the thickness becomes somewhat thinner than that in the natural state before the compression.

The sizes of the gaps 34 are decreased in the thickness direction of the backing sheet 32 by the entrance of the molten resin R into the countless gaps 34 of the backing sheet 32 or the compression due to the resin pressure. Then, at the joining part of the permeable sheet S to the sheet joining part 11 of the injection molded portion (cover main body 10), in cooperation with the entrance of the molten resin R, the permeability becomes lower as compared with the natural state, and the sealing property is improved. Thus, at the joining part, in any of orthogonal and parallel directions to the surface of the backing sheet 32, the sealing property is improved as compared with the portion in the natural state, and even if a water droplet or the like adheres to the outside of the joining part, it does not enter inside through this.

Further, in the case where the permeable sheet S held by the large vent hole forming protrusion 54 (annular projection part 56) of the core mold $F_2$ is compressed, the molten resin R does not flow into the inside of the compressed part of the permeable sheet S across the tip of the large vent hole formation protrusion 54 (annular projection part 56). The minute pores 33 and/or the gaps 34 of the compression part of the permeable sheet main body 31 and the backing sheet 32 of the permeable sheet S are collapsed, and the portion where the size becomes smaller than that in the natural state and the sealing property is improved is formed to be annular.

In the above description, although the description has been given of the case where by the anchor effect caused by the entrance of the molten resin into the minute pores of the permeable sheet or the gaps, the permeable sheet of the permeable member is joined (fixed) to the sheet joining part of the outer peripheral part of the large vent hole of the molded product, in order to further raise the joining strength, there is a following method. That is, by the combination of the material of the backing sheet of the permeable sheet and the material of the resin used for the injection molding of the molded product (the cover main body 10 in this embodiment), in addition to the anchor effect, firmer fixing by a welding effect can be obtained.

For example, unwoven fabric of polyester resin may be used for the backing sheet, and PA resin or POM resin may be used for the injection molding material. Alternatively, when olefin resin is used for the backing sheet, and PP resin or PE resin is used for the injection molding material, at the time of the injection molding, both the resins are welded to each other, and firm fixing can be obtained.

Besides, a method of raising the joining strength of both by combining materials of resins having mutual solubility can also be applied between the material of the resin of the molded product (the cover main body 10 of this embodiment) and the material of the resin of the resin molded product (the cover insert member $C_1$ in this embodiment) constituting the permeable member, and is preferable. If the mutual solubility exists between both, when the high temperature molten resin is injected, it slightly melts the outer surface of the resin molded product of the permeable member in contact with the molten resin to be capable of obtaining the firm fixing by welding, and the joining strength of the permeable member to the molded product is raised. Further, the airtightness between them is also raised.

Then, in a molded product extraction step, the pair of molds $F_1$ and $F_2$ are opened, and the cover 2 integrated with the permeable member $A_1$ is extracted. By manufacturing the cover 2 as the casing member integrated with the permeable member $A_1$ in this way, it is possible to omit a step of, for example, separately bonding the permeable sheet S to the cover main body 10 to join them. Besides, since there is no fear that the adhesive strength varies by a variation in the quantity of an adhesive to be used or in the pressing force of the permeable sheet as in the connector casing E' of the conventional structure, the cover main body 10 and the permeable sheet S have sufficient and stable joining strength. Incidentally, when the cover insert member $C_1$ of the permeable member $A_1$ and the cover main body 10 are not welded, if a liquid adhesive also serving as a seal is applied to the joining portion after the extraction, the airtightness between both can also be raised. Then, as shown in FIG. 2, after desired equipment is mounted in the casing main body 1, the fitting projection part 5 and the fitting recess part 6 provided at the back peripheral part of the cover 2 having the permeable member $A_1$ are fitted to the corresponding portions of the periphery of the casing main body 1 by using an adhesive serving as a sealant as well. By this, when assembling is carried out while the inside is brought into a substantially sealed state, the connector casing E of a finished product is obtained. Incidentally, in the above, a description has been given of a method for manufacturing, as the casing member, the cover 2 integrated with the permeable member $A_1$ and having the large vent hole $H_0$. However, as another casing member, also in the case where the large vent hole $H_0$ is formed in the casing main body 1, the casing main body 1 integrated with the permeable member $A_1$ can be manufactured by the injection molding in the same manner.

When the casing members manufactured as set forth above are assembled and used, for example, in the use state of the connector casing E, when the inner air is expanded by heat generation due to the operation of the equipment therein, the inner pressure becomes higher than the atmospheric pressure, and the expanded air is discharged to the outside through the permeable sheet S of the permeable member $A_1$ of the cover 2, so that the inner pressure of the casing E becomes equal to the outside atmospheric pressure. As stated above, an excessive rise in the inner pressure of the casing E is prevented by the operation of the permeable portion of the large vent hole $H_0$, the permeable sheet S covering the whole of the large vent hole $H_0$, and the respective small vent holes $H_1$ of the cover member $C_1$, and the seal portion of the casing main body 1 and the cover 2, or the like is not damaged by the pressure rise.

On the contrary, when the operation of the equipment is stopped, the heat generation from this stops, and the inner air is contracted in accordance with the lowering of the temperature. When the pressure of the inside of the casing E starts to lower, the outer air passes through the permeable member $A_1$, the respective small vent holes $H_1$, the permeable sheet S and the large vent hole $H_0$ and enters the inside. At this time, even if a water droplet or the like adheres to the permeable sheet S, although the permeable sheet main body 31 of this permeable sheet S allows air and moisture (water vapor) in the air to pass through, it does not allow a liquid having an extremely large size, such as the water droplet, as compared with the water vapor to pass through, so that the water droplet does not enter the inside of the casing E. By this, there does not occur such a case that the water droplet adheres to the equipment housed in the inside of the casing E and corrodes it, and an erroneous operation of the equipment or its trouble is prevented. The airtightness of the joining part of the permeable member $A_1$ and the cover main body 10 is sufficiently maintained, and infiltration of the water droplet or the like can be prevented.

Then, during the handling, use, or maintenance of the connector casing E, even if an external object collides against the surface of the permeable member $A_1$, since the small vent hole $H_1$ provided in the cover member $C_1$ is small as compared with the large vent hole $H_0$ provided in the cover main body 10, it merely collides against the main body part 21 of the cover member $C_1$, and hardly reaches and collides against the permeable sheet S of the back side. For example, even if a tip of a screw driver carelessly collides against the portion of the permeable member $A_1$ of the connector casing E, it merely collides directly against the surface of the main body part 21 of the cover insert member $C_1$, and does not reach the permeable sheet S of the inside (back side) through the small vent hole $H_1$. Accordingly, there does not occur such a case where the permeable sheet S is punctured and is damaged. In this way, since the permeable sheet S is protected by the cover insert member $C_1$ disposed outside (front side), it is possible to decrease the danger of the damage, such as tearing or peeling, of the permeable sheet S, which is caused by the contact of the external object. Then, since it is possible to prevent the permeable sheet S from being damaged by an unexpected situation, the connector casing E can continue to hold stable permeable performance.

Incidentally, in the above embodiment, as the permeable sheet of the permeable member, although one obtained by laminating the backing sheets 32 on both surfaces of the permeable sheet main body 31 is cited, it is also possible to use one obtained by laminating the backing sheet 32 on only one side of the permeable sheet main body 31, and a single one of the permeable sheet main body 31.

Figure 8:
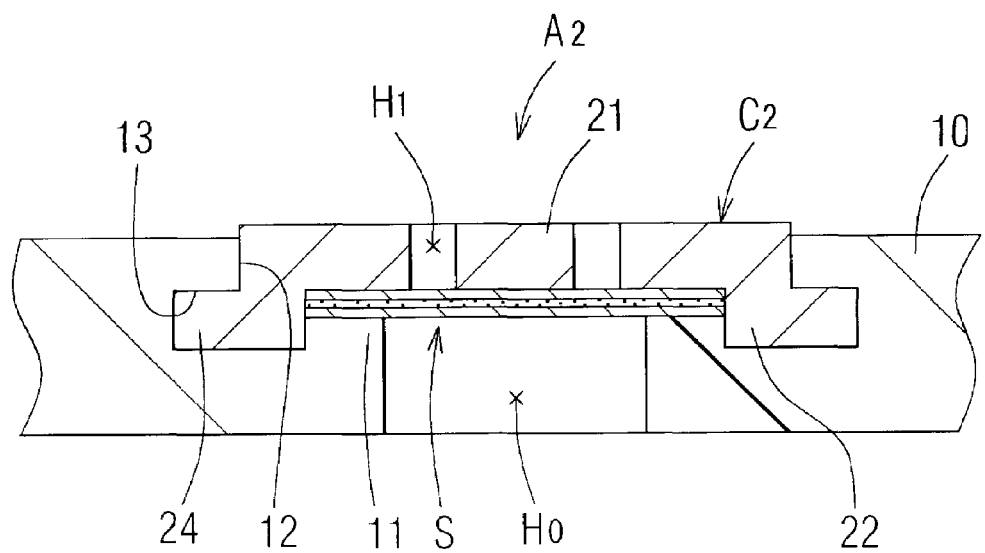
FIG. 8 is a partial sectional view of the use of a connector casing E using a casing member of a second embodiment.
Figure 9:
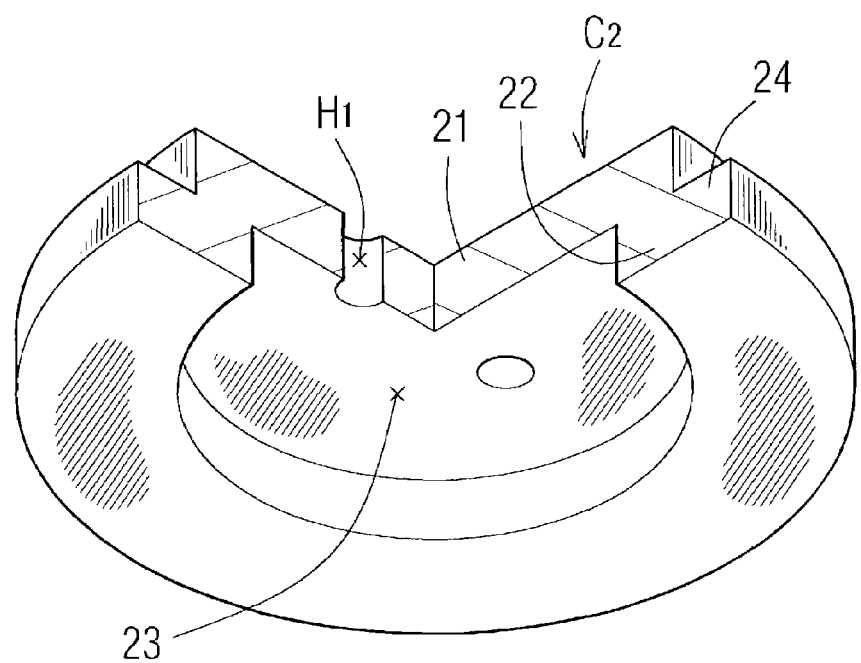
FIG. 9 is a partial sectional view of a cover member $C_2$ of FIG. 8.

Subsequently, other embodiments of the invention will be described. In respective portions of the other embodiments described below, the same portions as the already described portions are denoted by the same symbols, and the explanation and illustration are made. In a cover 2 of a second embodiment shown in FIG. 8 to FIG. 11, a cover insert member $C_2$ of a permeable member $A_2$ is different from that in the already described embodiment. As a result, a structure of integration of the permeable member $A_2$ and a cover main body 10 is different. This cover member $C_2$ has such a structure that an annular anchor part 24 is provided protrusively outside in a radius direction and integrally to have a step toward the inside at the outer peripheral side of the annular protrusion 22 of the foregoing cover insert member $C_1$ [see FIG. 9]. Then, this cover insert member $C_2$ has a merit that at the time of injection molding of the cover 2, it is embedded in the cover main body 10 and an undercut part 13 is formed at the outside of the anchor part 24, so that fixing strength to the cover main body 10 is raised [see FIG. 8].

Figure 10:
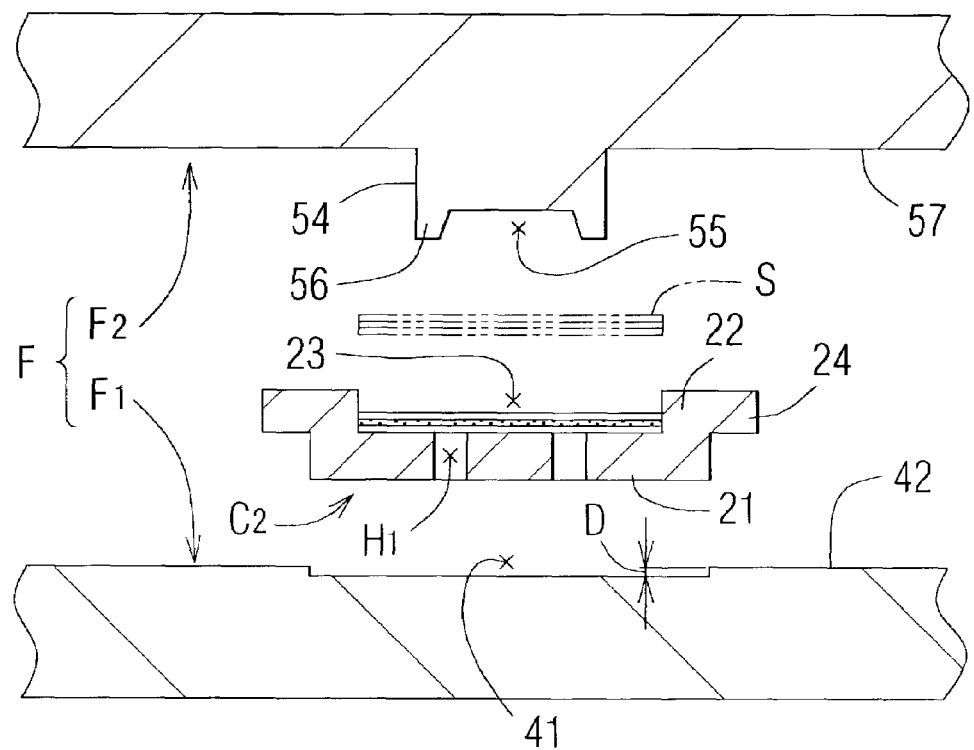
FIG. 10 is a partial sectional view of a state in which a mold F is opened to mold a cover 2.
Figure 11:
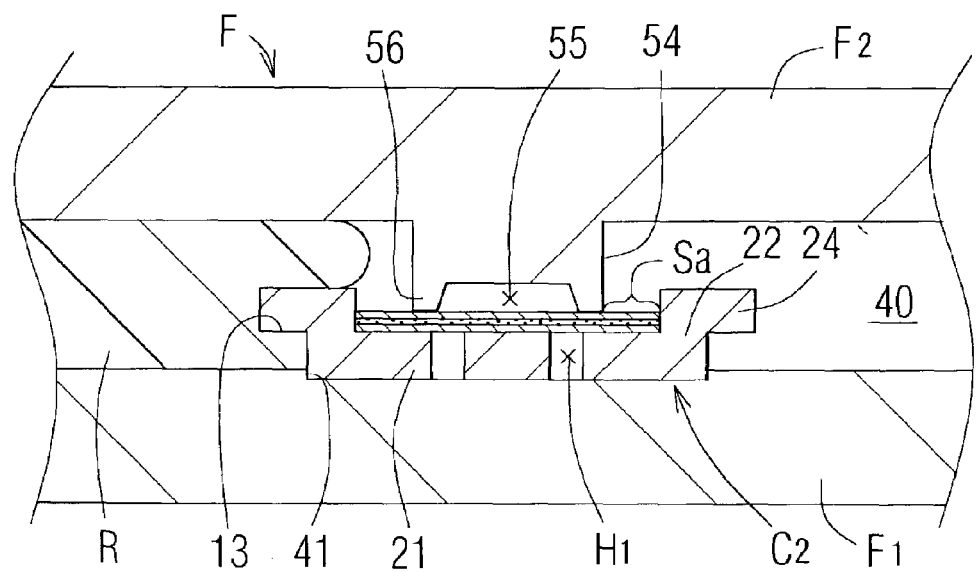
FIG. 11 is a partial sectional view of a state in which the mold is closed and injection molding is performed.

In order to injection mold the cover 2 having the permeable member $A_2$, an outer peripheral part of the cover insert member $C_2$ in which the permeable sheet S is received in the receiving recess part 23 is fitted to the positioning recess part 41 of the cavity mold $F_1$ and is set while its front side is faced downward [see FIG. 10]. Since the anchor part 24 is formed to be apart from the surface of the main body part 21 of the cover member $C_2$ in the thickness direction while keeping a predetermined measure, an annular space having a sufficient gap is formed in a set state between the surface of the anchor part 24 and the cavity mold surface 42 of the cavity mold $F_1$.

Thereafter, the core mold $F_2$ approaches the cavity mold $F_1$ in which the permeable member $A_2$ is set and is tightened. When molten resin R for forming the cover main body 10 is injected, the high temperature liquid molten resin R sequentially flows into the left half of the cavity 40 and flows to the right side [see FIG. 11]. Then, when it further flows to the right side and collides against the outer periphery of the anchor part 24 of the cover insert member $C_2$, its flow direction is divided into the upper part and the lower part in the drawing. The molten resin R flowing upward goes over the anchor part 24 and the annular protrusion 22 to flow into the inside receiving recess part 23 and is joined to the permeable sheet S, while the molten resin R flowing downward flows into the annular space part formed between the surface of the anchor part 24 and the molding surface 42 to form the undercut part 13 of the cover main body 10.

Then, after a pressure keeping step, the cover 2 integrated with the permeable member $A_2$ is ejected out. In the integrated portion of the cover main body 10 and the permeable member $A_2$, the anchor part 24 of the cover insert member $C_2$ is embedded in the undercut part 13 of the outer periphery of the integrated part 12 of the cover main body 10, and the anchor part 24 of the cover insert member $C_2$ is hard to extract outward [see FIG. 8]. Thus, even if the cover main body 10 and the cover insert member $C_2$ are formed of resin materials which do not have mutual solubility and are not welded to each other, both can be mechanically joined by embedding the anchor part 24 of the cover member $C_2$ in the undercut part 13 of the cover main body 10. Accordingly, it is possible to omit such an operation as to apply an adhesive to the joining part of the cover main body 10 and the cover member $C_2$ by a subsequent step in order to reinforce the joining strength of the cover main body 10 and the permeable member $A_2$, and the production can be efficiently conducted. Incidentally, also in the case where the material of the cover member is molded out of a material (for example, metal) other than resin, which is difficult to be mutually bonded and welded to the casing member main body (cover main body 10), the joining strength can be kept similarly to the above, and it is effective. Besides, the airtightness at the joining part of the cover main body 10 and the permeable member $A_2$ is sufficiently secured since the permeable sheet S and the cover main body 10 are joined by the anchor effect at the sheet joining part 11, and there is no fear that a water droplet or an oil droplet infiltrates.

Figure 12:
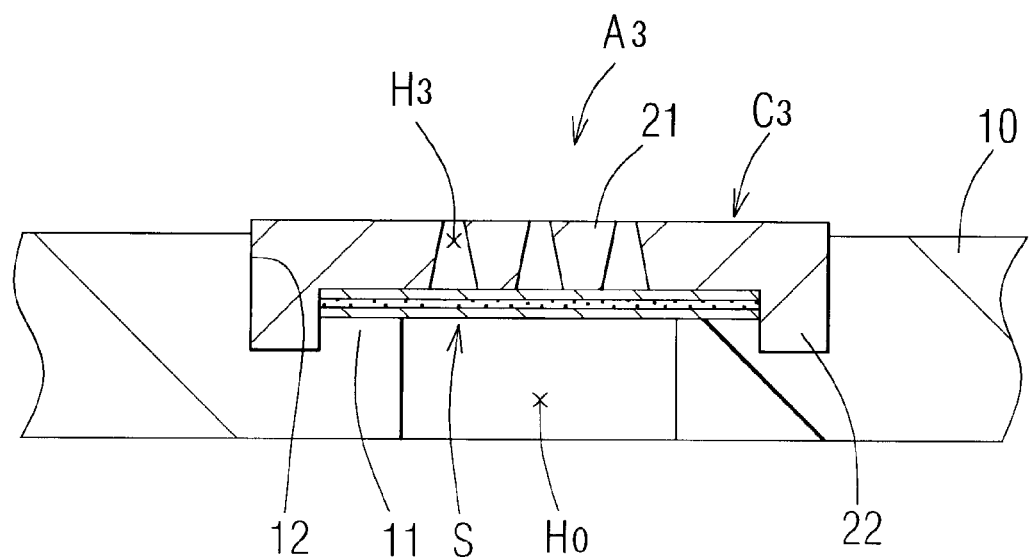
FIG. 12 is a partial sectional view of the use of a connector casing E using a casing member of a third embodiment.
Figure 13:
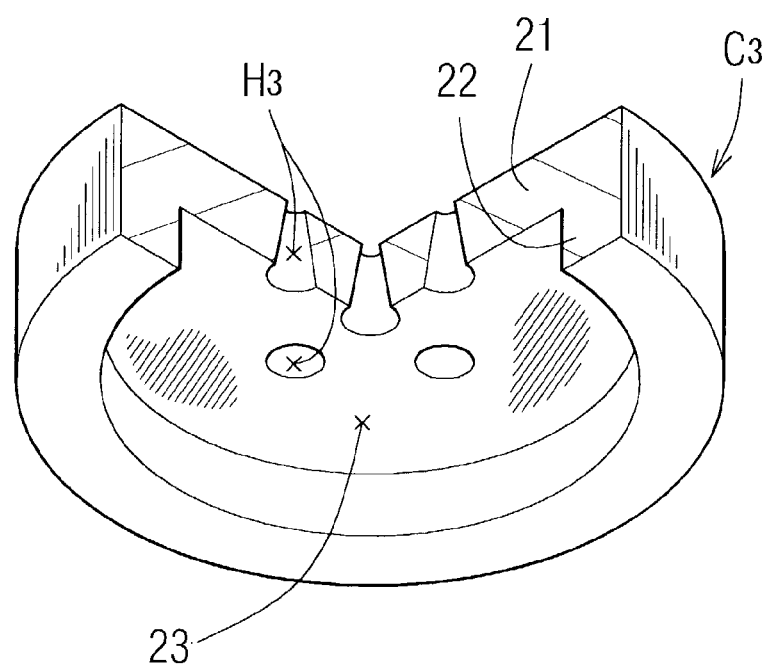
FIG. 13 is a partial sectional perspective view of a cover member $C_3$ of the FIG. 12.

Subsequently, a third embodiment of the invention will be described. In connector casings E of third to sixth embodiments described below, the shapes and boring positions of small vent holes $H_3$ to $H_6$ of cover members $C_3$ to $C_6$ constituting respective permeable members $A_3$ to $A_6$ are mainly different from the already described embodiments. Molding methods of covers having the respective permeable members $A_3$ to $A_6$ are the same as the already described molding methods. As shown in FIG. 12 and FIG. 13, similarly to the cover insert member $C_1$, in this cover insert member $C_3$, small vent holes $H_3$ are formed to pierce at one place of the center of the main body part 21 and at four equally spaced places on the same circumferences, that is, at the five places in total. Each of the small vent holes $H_3$ is formed to become a tapered hole in which its inner diameter gradually becomes large from the front side of the body part 21 of the cover member $C_3$ to the back side (that is, toward the side of the permeable sheet S). Accordingly, in the permeable portion of the permeable member $A_3$, its effective area at the side of the permeable sheet S becomes larger than that at the front side of the cover insert member $C_3$. Thus, even if the inner diameter of the small vent hole $H_3$ of the outside cover member $C_3$ of the cover main body 10 at the surface side is made small, the effective permeable area at the side of the permeable sheet S for permeation (at the back side) is secured, and lowering of the permeable function can be suppressed. In this way, the probability that an external object will come in direct contact with the permeable sheet S from the outside of the cover 2 can be made smaller.

Figure 14:
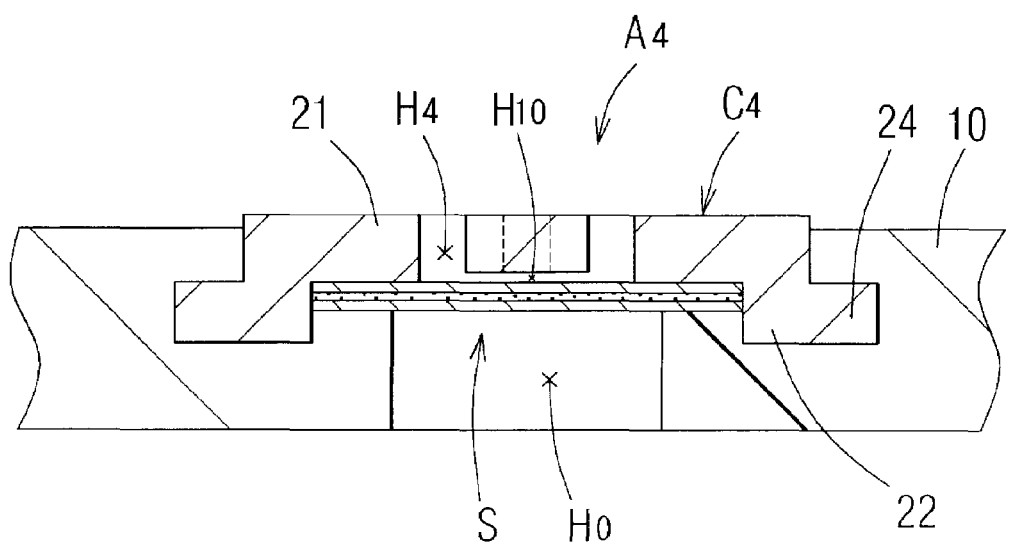
FIG. 14 is a partial sectional view of the use of a connector casing E using a casing member of a fourth embodiment.
Figure 15:
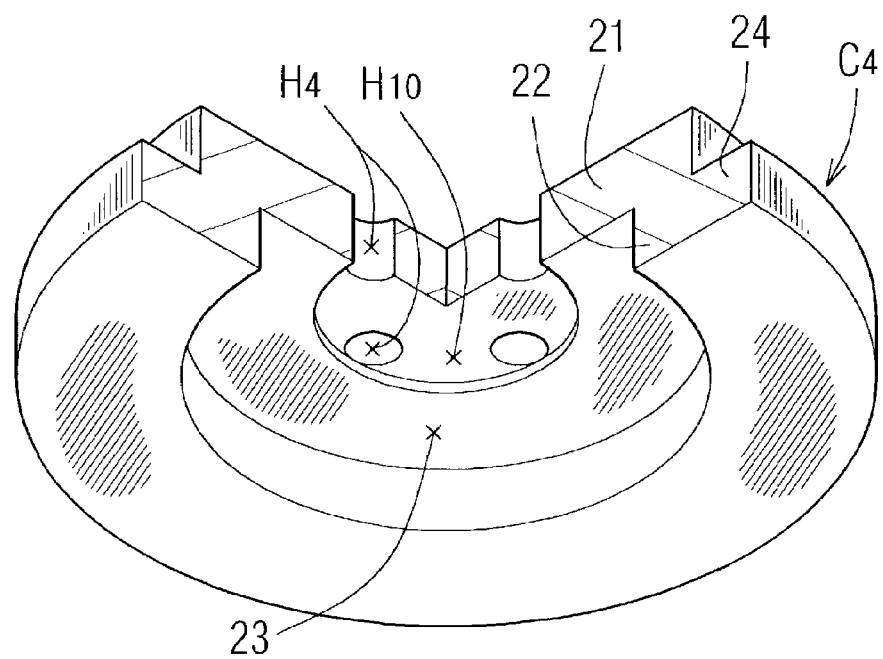
FIG. 15 is a partial sectional perspective view of a cover member $C_4$ of the FIG. 14.

A fourth embodiment of the invention will be described below. As shown in FIG. 14 and FIG. 15, this cover insert member $C_4$ has the same structure as the above cover insert member $C_2$, except for portions of small vent holes $H_4$, and has such a structure in that the small vent holes $H_4$ are formed at four equally spaced places on the same circumference in the main body part 21. A clearance hole part $H_{10}$ of a circular shallow groove shape communicating with all of the four small vent holes $H_4$ is formed at the back side of the main body part 21. The clearance hole part $H_{10}$ is a circular recess part provided at the bottom of the receiving recess part 23 of the cover insert member $C_4$ to be slightly recessed to the front side, and is provided so that when the cover insert member $C_4$ is integrated with the cover main body 10, it faces the large vent hole $H_0$ through the permeable sheet S.

Accordingly, the area of the small vent holes $H_4$ formed in the cover member $C_4$ at the side of the permeable sheet S becomes a wide area of the clearance hole part $H_{10}$, and the permeable performance can be improved more than in the case of only the small vent holes $H_4$.

Figure 16:
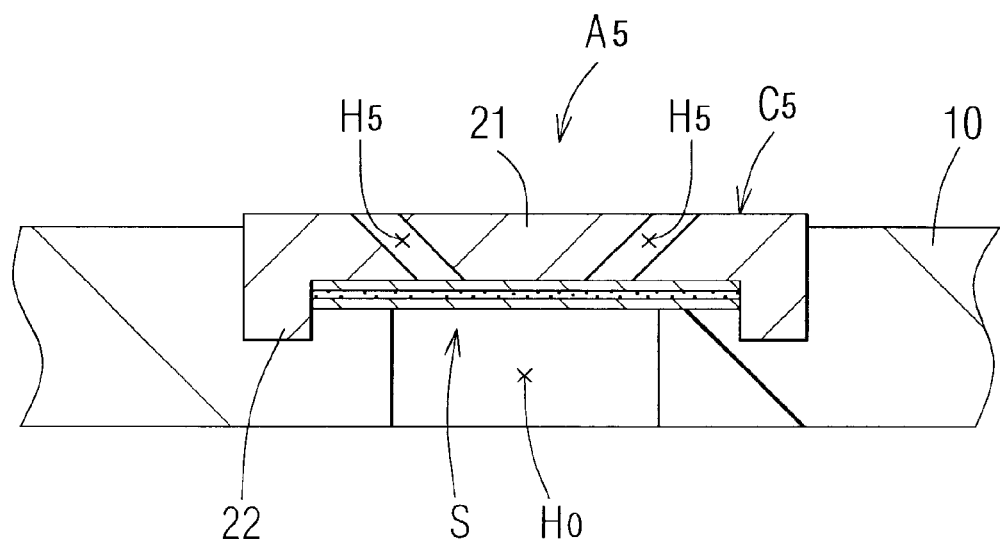
FIG. 16 is a partial sectional view of the use of a connector casing E using a casing member of a fifth embodiment.
Figure 17:
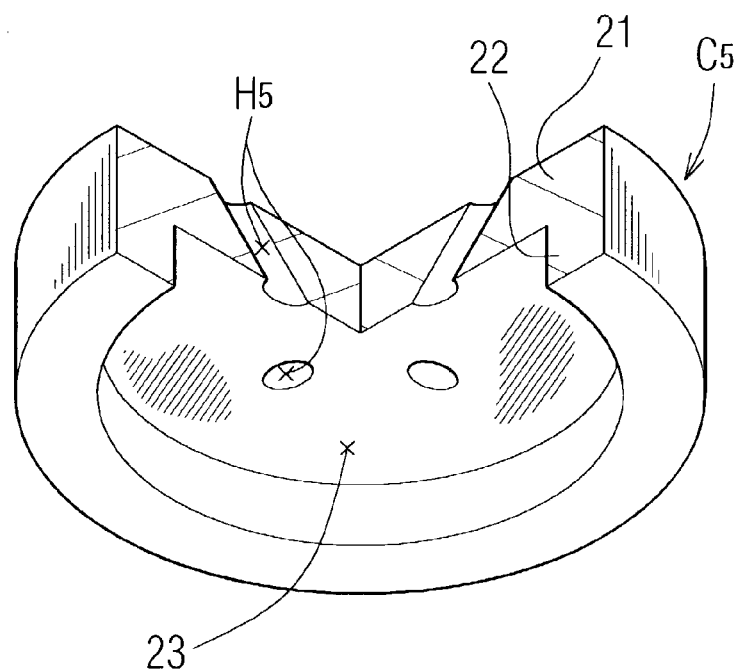
FIG. 17 is a partial sectional perspective view of a cover member $C_5$ of the FIG. 16.

Subsequently, fifth and sixth embodiments of the invention will be described. As shown in FIG. 16 and FIG. 17, the cover insert member $C_5$ of the fifth embodiment has the same structure as the cover insert member $C_1$ of the first embodiment except for portions of small vent holes $H_5$, and has such a structure that the small vent holes $H_5$ are formed to be slanted toward its own outer surface (periphery) or inner surface (center) at four equally spaced places on the same circumferences in the main body part 21. That is, in each of the small vent holes $H_5$, an opening at the inner surface side is closer to the center of the cover member $C_5$ than an opening at the outer surface side, both the openings are slanted in the same radius direction at an obtuse angle with respect to the permeable sheet, and the opening at the inner surface side is disposed within the large vent hole $H_0$.

Figure 18:
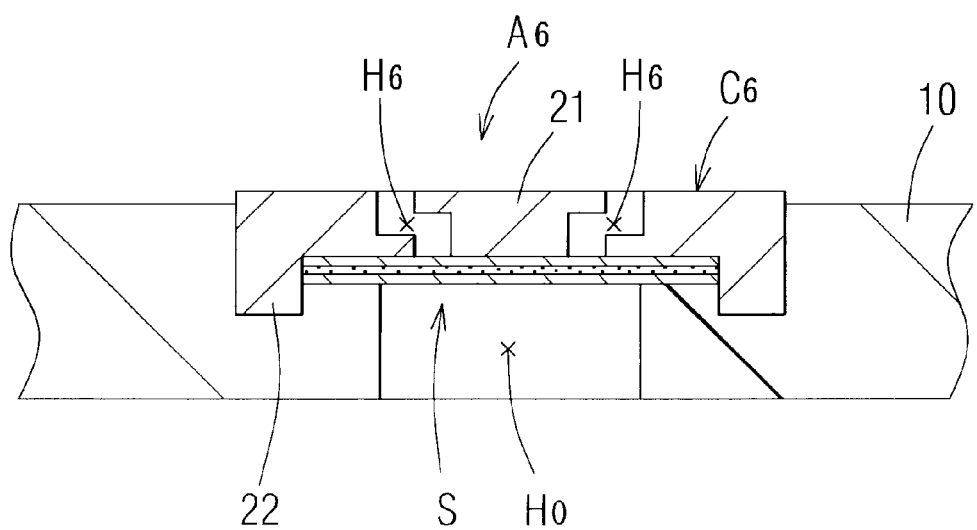
FIG. 18 is a partial sectional view of the use of a connector casing E using a casing member of a sixth embodiment.
Figure 19:
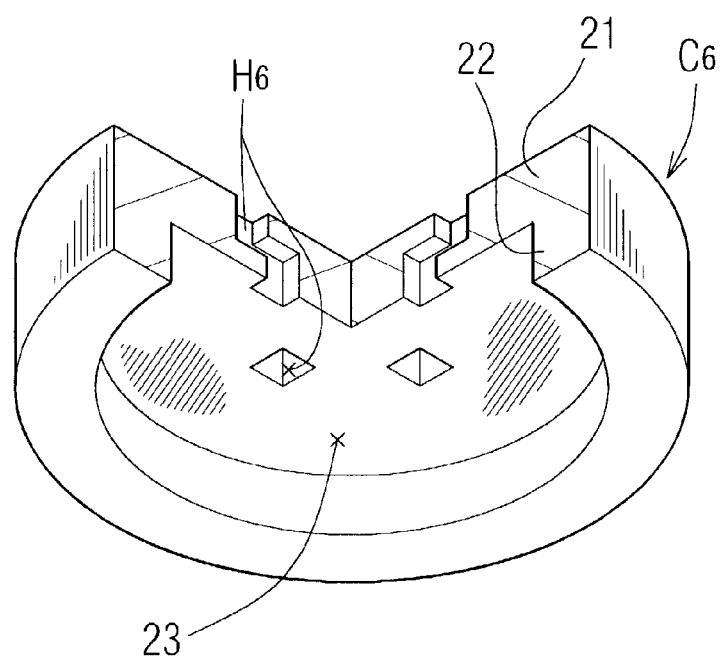
FIG. 19 is a partial sectional perspective view of a cover member $C_6$ of the FIG. 18.
Figure 20:
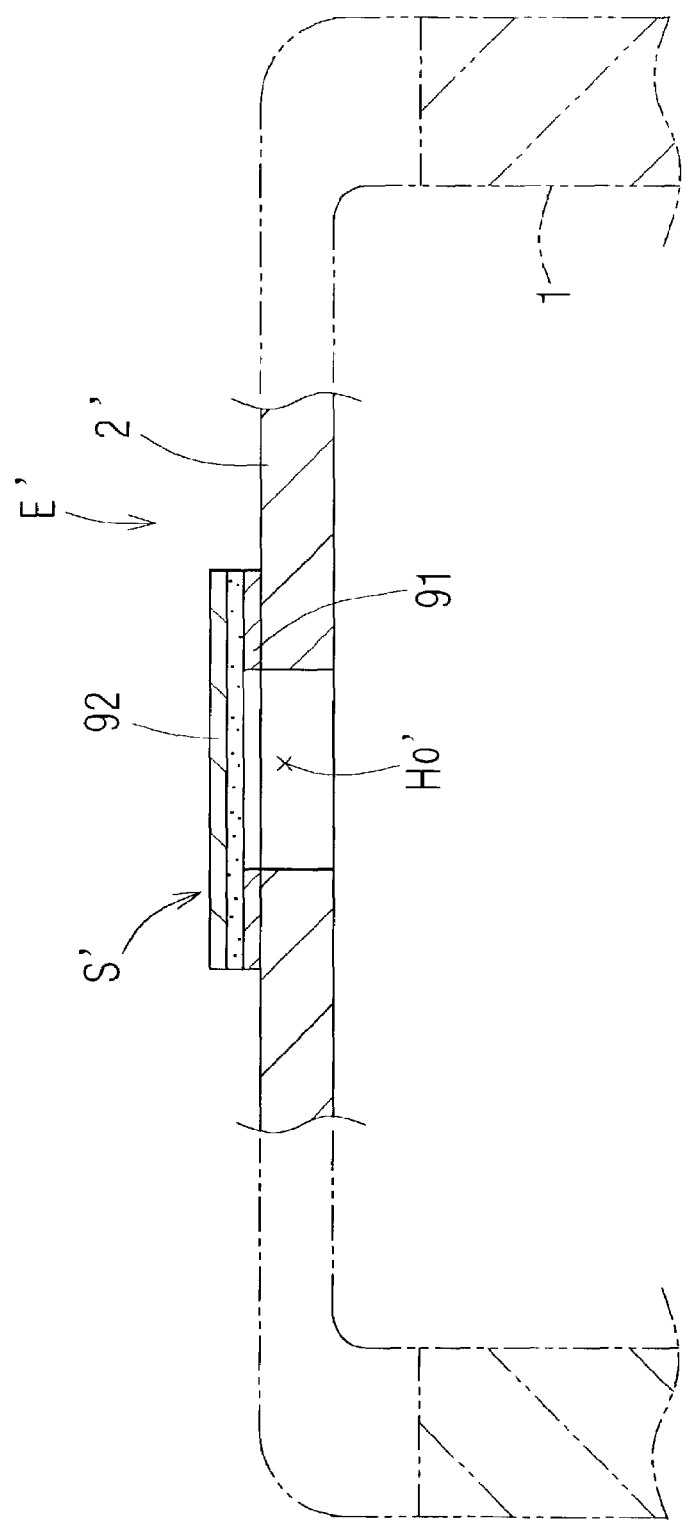
FIG. 20 is a partial sectional view of the use of a connector casing E' having a conventional structure.

As shown in FIG. 18 and FIG. 19, the cover insert member $C_6$ of the sixth embodiment has the same structure as the cover member $C_1$ of the first embodiment except for portions of small vent holes $H_6$, and the small vent holes $H_6$ having square cross sections are formed at four equally spaced places on the same circumferences in the main body part 21 and are bent halfway with respect to the surface of the permeable sheet S. That is, the small vent hole $H_6$ has such a shape that the whole hole is formed to be bent in the radius direction when viewed in a longitudinal section.

In general, with respect to the contact or penetration of a small object to the casing from the outside, there are many cases where it penetrates in a direction orthogonal to the surface of the permeable sheet S. Thus, like the small vent holes $H_5$ of the fifth embodiment or the small vent holes $H_6$ of the sixth embodiment, when the piercing direction is slanted with respect to the surface of the permeable sheet S or is shaped to be bent halfway, even if an object enters from the outside, a further advance can be stopped by the slanted surface portion or the bent portion on the way to the surface of the permeable sheet S. In this way, it is possible to effectively prevent the penetration into the inside and the contact with the permeable sheet S, and the damage of the permeable sheet S can be prevented.

As another casing according to the invention, the following can be cited. When the invention is carried out for a casing of a vehicle electric motor, and when a vehicle provided with a power window falls into the water by an accident or the like, especially the infiltration of water into the electric motor provided in a door is prevented, and even if it falls into the water and the motor in the door is submerged, for a definite time (for example, five minutes) thereafter, the rise and fall window can be opened and closed by actuating the motor by a switch operation in the vehicle. As a result, a person confined in the vehicle falling in the water can escape to the outside, and the safety can be secured.

The invention can be carried out even for a casing in which electric equipment [ECU (ELECTRONIC CON- TROL UNIT), etc] is housed in the inside, and the function and effect are the same as those of the first embodiment.

The invention can be carried out also for a toner cartridge of a business machine printer, and toner in the cartridge is decreased with use. Due to this decrease, the inner space develops a negative pressure, and a discharge amount of toner is decreased or becomes unstable. However, air is supplied into the toner cartridge by carrying out the invention, and the negative pressure can be prevented from being generated.

The invention can also be carried out for a head lamp housing of a vehicle. In accordance with lighting or extinction of a head lamp, the air temperature in the housing is raised or dropped, and the air in the housing is expanded or contracted to generate a pressure variation, and there is a case where a seal part is damaged by this pressure variation (especially in wet weather). When the lamp is switched off, the pressure in the housing is lowered, and when damage occurs in the seal portion, rainwater is sucked from this portion and is stored in the housing). However, this can be prevented by carrying out the invention.

The invention can be carried out also for a housing of an illuminator used in the inside of a house or a bathroom, and the function and effect are almost identical to those of the head lamp housing of the vehicle.

Further, the invention can be carried out also for a casing for communication equipment such as a portable telephone. By carrying out the invention, in the case where the communication equipment such as the portable telephone is used outdoors, it is possible to prevent a water droplet from infiltrating into the inside to cause an erroneous operation.

In the casing member of the invention, although the permeation between its inside and outside can be realized, the infiltration of a water droplet, an oil droplet, or dust etc. into the inside is prevented. Even if contact with the permeable member occurs carelessly, or even if an external object such as a small object is going to come in contact with the permeable member, since the probability of direct contact with the permeable sheet is lowered, it is possible to lower the danger that the permeable sheet is damaged.

In the method of manufacturing the casing member according to the invention, a subsequent additional step such as bonding, adhesion, or welding is not required, and the permeable member can be integrated at the time of injection molding of the casing main body as the casing member and/or the cover. Accordingly, the joining part of the permeable sheet integrally joined to the casing member becomes stable. Further, even if the mold is heated up to a high temperature by preheating, since the permeable sheet is positioned apart from the mold surface through the cover member and does not come in direct contact, the casing member functions as a heat insulating material, the permeable sheet is protected, and its heat deformation and heat damage can be prevented. As the result of these, the permeable function of the casing member is not damaged for a long period and is certainly effected.

What is claimed is:

1. A casing member comprising:
   a main body having a first vent hole extending through said main body, a sheet joining part surrounding said first vent hole at a periphery of said first vent hole, and a cover insert member receiving recess surrounding said sheet joining part at a periphery of said sheet joining part;
   a cover insert member having a main portion and an annular protrusion protruding from said main portion in a thickness direction of said main portion, said annular protrusion being located within said cover insert member receiving recess of said main body so that said cover insert member is joined to said main body, and having a second vent hole extending through said cover insert member, said second vent hole having a smaller cross-sectional area than said first vent hole; and
   a permeable sheet for allowing permeation of a gas therethrough and for preventing permeation of a liquid therethrough, said permeable sheet having a first surface and a second surface opposite said first surface, said permeable sheet being arranged so that a peripheral portion of said first surface is bonded to said main body and so that a peripheral portion of said second surface contacts said cover insert member such that a peripheral portion of said permeable sheet is held between said main body and said cover insert member, said permeable sheet being arranged so as to cover said first vent hole, and said first vent hole of said main body and said second vent hole of said cover insert member being arranged to communicate with each other through said permeable sheet.

2. The casing member of claim 1, wherein said cover insert member has an anchor part protruding outwardly in a radial direction with respect to said cover insert member, said anchor part being embedded within said main body.

3. The casing member of claim 1, wherein said second vent hole comprises a tapered hole such that a cross-sectional area at an end of said second vent hole closest to said permeable sheet is larger than a cross-sectional area at an end of said second vent hole farthest from said permeable sheet.

4. The casing member of claim 1, wherein said cover insert member has a plurality of second vent holes extending therethrough, and has a clearance hole part for interconnecting said plurality of second vent holes.

5. The casing member of claim 1, wherein said second vent hole is slanted so as to extend at an obtuse angle with respect to a surface of said permeable sheet.

6. The casing member of claim 1, wherein said second vent hole has a bend at a midpoint therethrough.

7. The casing member of claim 1, wherein said main body and the cover insert member are joined to each other by bonding or welding.

8. The casing member of claim 1, wherein said cover insert member has a plurality of second vent holes extending therethrough.

9. The casing member of claim 8, wherein said plurality of second vent holes are arranged in a circle concentric with said first vent hole.

10. The casing member of claim 8, wherein said plurality of second vent holes are arranged within an area no larger than the cross-sectional area of said first vent hole, and are located closer to a central axis of said first vent hole than to a periphery of said first vent hole.

11. The casing member of claim 1, wherein said cover insert member has a permeable sheet receiving recess, said permeable sheet being fitted within said permeable sheet receiving recess.

12. The casing member of claim 11, wherein a cross-sectional area of said permeable sheet receiving recess is larger than the cross-sectional area of said first vent hole.

13. The casing member of claim 11, wherein a cross-sectional area of said permeable sheet receiving recess is larger than a cross-sectional area of said second vent hole.

14. The casing member of claim 11, wherein said annular protrusion is arranged so as to surround and form said permeable sheet receiving recess, an inner peripheral shape of said permeable sheet receiving recess being substantially identical to an outer peripheral shape of said permeable sheet.

15. The casing member of claim 14, wherein said annular protrusion protrudes a distance greater than a thickness of said permeable sheet.

16. The casing member of claim 11, wherein said main body is formed of synthetic resin, said permeable sheet having a plurality of pores, a portion of said synthetic resin of said main body at said sheet joining part being located within a portion of said pores of said permeable sheet at said peripheral portion of said permeable sheet so as to anchor said permeable sheet to said main body.

17. The casing member of claim 16, wherein said pores of said permeable sheet at said peripheral portion of said permeable sheet are smaller in size than a remainder of said pores of said permeable sheet.

* * * * *